United States Patent
Liu et al.

(10) Patent No.: US 12,087,714 B2
(45) Date of Patent: Sep. 10, 2024

(54) REDUCTION OF CRACKS IN PASSIVATION LAYER

(71) Applicant: Taiwan Semiconductor Manufacturing Co., Ltd., Hsinchu (TW)

(72) Inventors: Kuo-An Liu, Hsinchu (TW); Wen-Chiung Tu, Hsinchu (TW); Yuan-Yang Hsiao, Hsinchu (TW); Kai Tak Lam, Hsinchu (TW); Chen-Chiu Huang, Hsinchu (TW); Zhiqiang Wu, Hsinchu County (TW); Dian-Hau Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 249 days.

(21) Appl. No.: 17/589,500

(22) Filed: Jan. 31, 2022

(65) Prior Publication Data

US 2023/0145953 A1    May 11, 2023

Related U.S. Application Data

(60) Provisional application No. 63/276,828, filed on Nov. 8, 2021.

(51) Int. Cl.
*H01L 23/00* (2006.01)

(52) U.S. Cl.
CPC .... *H01L 24/02* (2013.01); *H01L 2224/02311* (2013.01); *H01L 2224/02331* (2013.01); *H01L 2224/02373* (2013.01); *H01L 2224/0239* (2013.01); *H01L 2224/024* (2013.01); *H01L 2924/01013* (2013.01); *H01L 2924/01027* (2013.01); *H01L 2924/01028* (2013.01); *H01L 2924/01029* (2013.01); *H01L 2924/04941* (2013.01); *H01L 2924/04953* (2013.01); *H01L 2924/05042* (2013.01);

(Continued)

(58) Field of Classification Search
CPC ...................................................... H01L 24/02
See application file for complete search history.

(56) References Cited

U.S. PATENT DOCUMENTS

| | | | |
|---|---|---|---|
| 7,727,876 B2 * | 6/2010 | Lin | H01L 24/13 438/612 |
| 10,861,810 B2 | 12/2020 | Huang et al. | |
| 11,031,325 B2 | 6/2021 | Shen et al. | |

(Continued)

FOREIGN PATENT DOCUMENTS

| | | |
|---|---|---|
| TW | 201911515 A | 3/2019 |
| TW | 202044436 A | 12/2020 |

*Primary Examiner* — Nathan W Ha
(74) *Attorney, Agent, or Firm* — Haynes and Boone, LLP

(57) ABSTRACT

Methods and semiconductor structures are provided. A semiconductor structure according to the present disclosure includes a plurality of transistors, an interconnect structure electrically coupled to the plurality of transistors, a metal feature disposed over the interconnect structure and electrically isolated from the plurality of transistors, an insulation layer disposed over the metal feature, and a first redistribution feature and a second redistribution feature disposed over the insulation layer. A space between the first redistribution feature and the second redistribution feature is disposed directly over at least a portion of the metal feature.

20 Claims, 21 Drawing Sheets

(52) U.S. Cl.
CPC ............... *H01L 2924/19041* (2013.01); *H01L 2924/19104* (2013.01); *H01L 2924/35121* (2013.01)

(56) References Cited

U.S. PATENT DOCUMENTS

| | | | |
|---|---|---|---|
| 2008/0150161 A1* | 6/2008 | Lin | H01L 24/13 |
| | | | 257/E23.141 |
| 2009/0152741 A1* | 6/2009 | Chang | H01L 25/0657 |
| | | | 257/E21.59 |
| 2009/0283877 A1* | 11/2009 | Tsai | H01L 24/05 |
| | | | 257/659 |
| 2017/0213798 A1* | 7/2017 | Wei | H01L 24/14 |
| 2017/0271283 A1* | 9/2017 | Lee | H01L 24/19 |
| 2018/0040585 A1* | 2/2018 | Yu | H01L 24/17 |
| 2019/0067035 A1* | 2/2019 | Paek | H01L 21/4857 |
| 2019/0157222 A1* | 5/2019 | Lakhera | H01L 21/78 |
| 2021/0375742 A1* | 12/2021 | Li | H01L 24/02 |
| 2023/0090181 A1* | 3/2023 | Li | H01L 24/02 |

\* cited by examiner

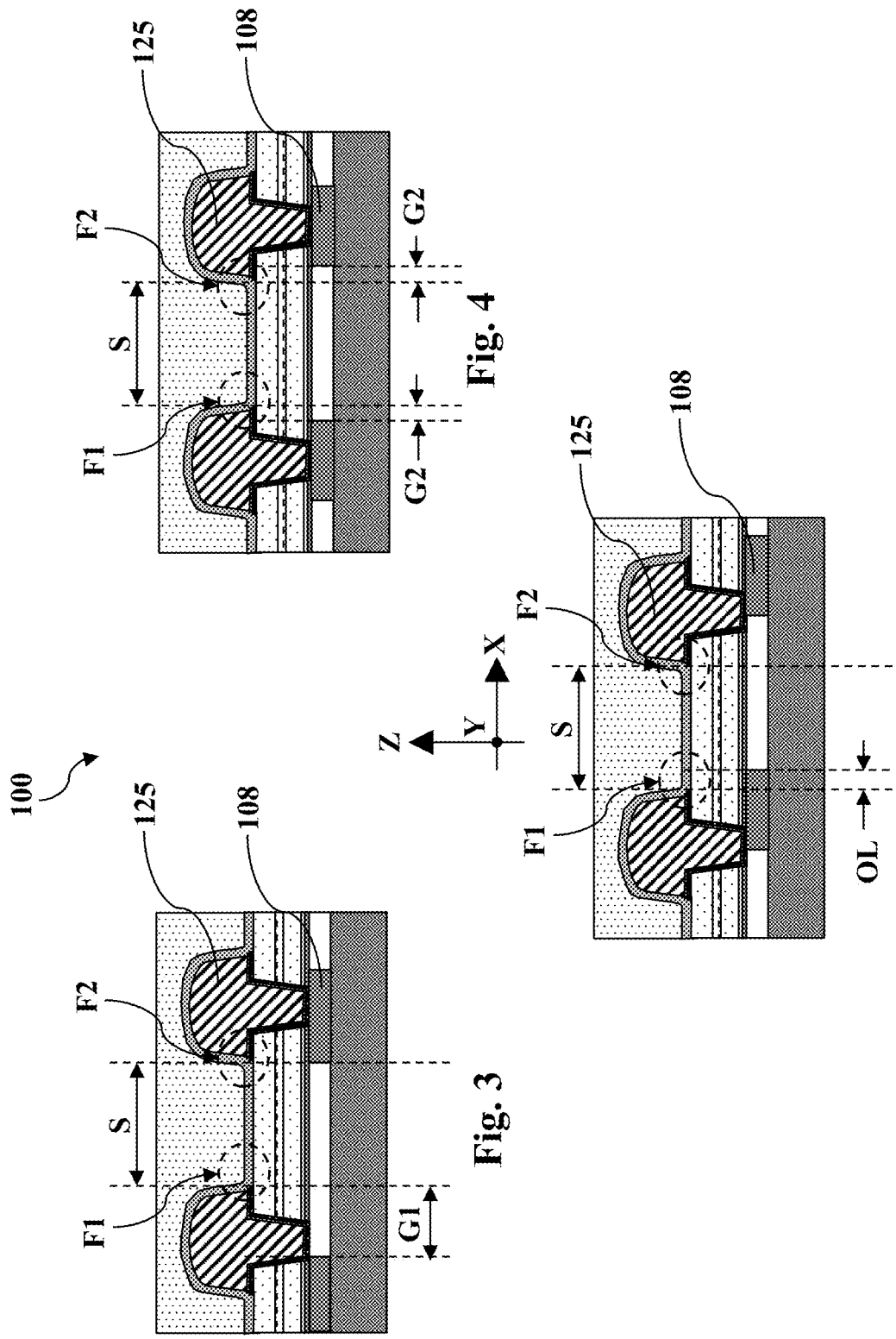

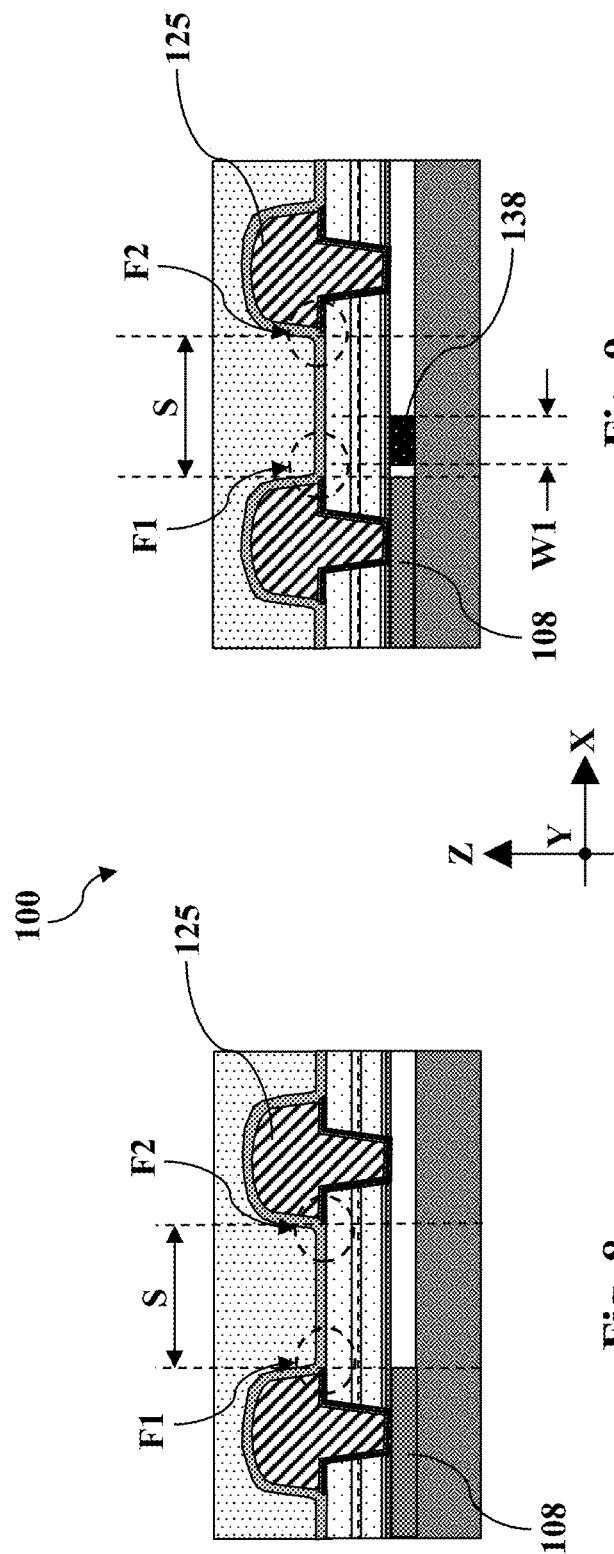
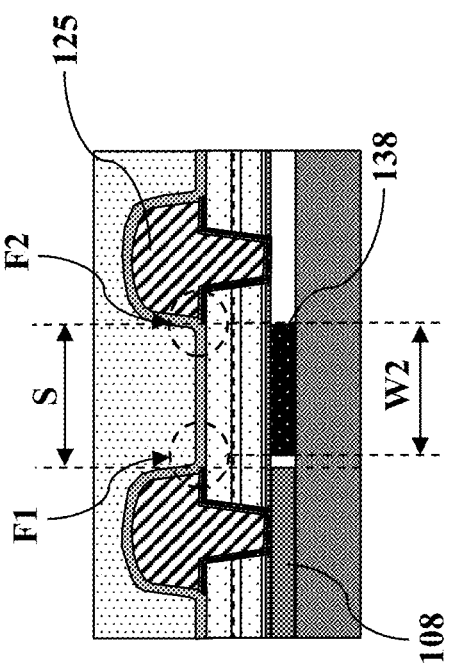
Fig. 8
Fig. 9
Fig. 10

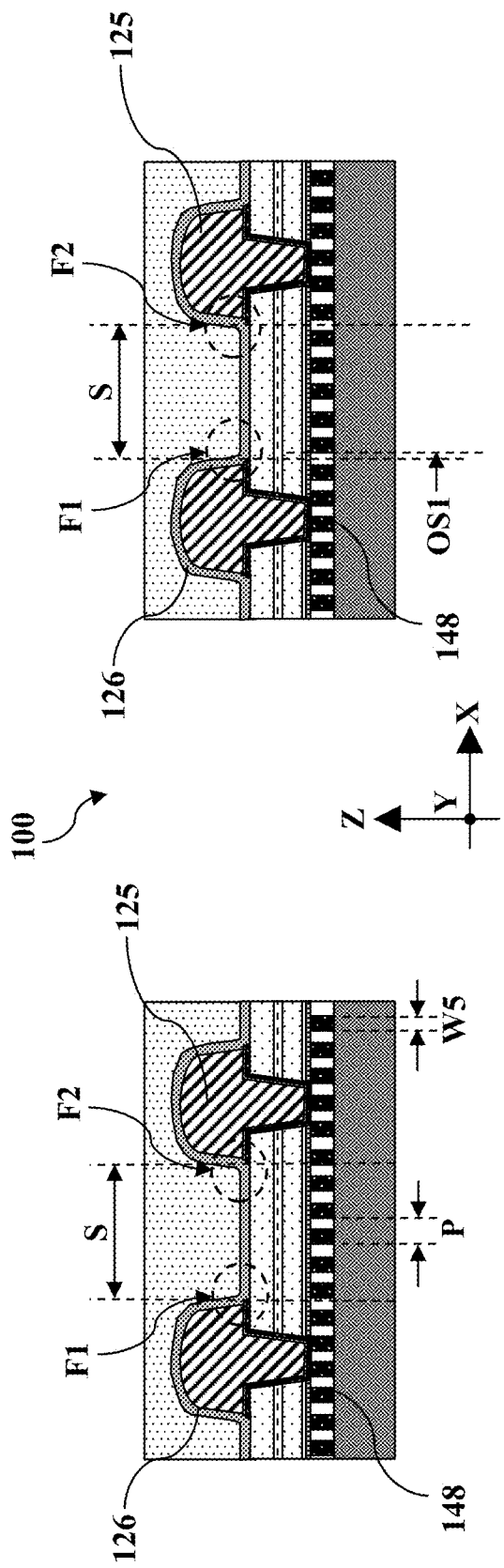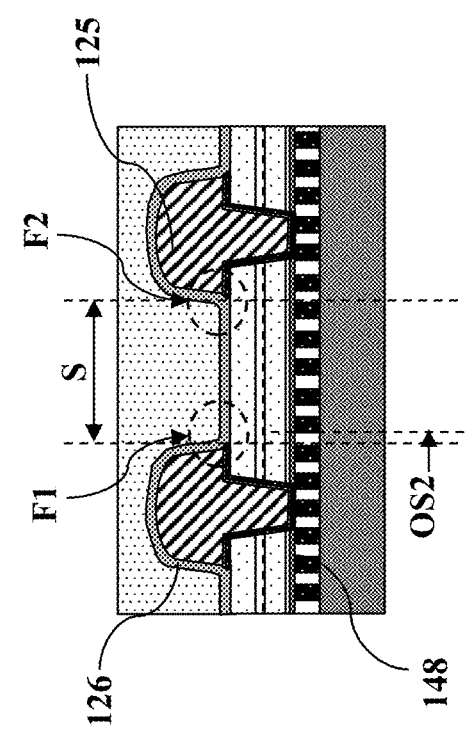

REDUCTION OF CRACKS IN PASSIVATION LAYER

PRIORITY DATA

The present application claims the benefit of U.S. Provisional Application No. 63/276,828, entitled "Reduction of Cracks in Passivation Layer," filed Nov. 8, 2021, the entirety of which is herein incorporated by reference.

BACKGROUND

Semiconductor devices include various semiconductor features, metal features and dielectric features. Oftentimes dielectric features are placed right next to metal features to provide insulation and diffusion barrier. Dielectric materials and metals have vastly different coefficients of thermal expansion (CTE) and this CTE mismatch may cause stress high enough to peel the passivation layer from surfaces of the metal features. For example, a dielectric passivation layer may be disposed over redistribution features in a redistribution layer (RDL) to insulate the redistribution features. When a workpiece is cooling down from an elevated temperature for deposition of the passivation layer, the metal redistribution layer may shrink more in volume than the neighboring passivation layer, resulting in peeling or cracks. Sometimes a crack can propagate downward, causing further damages in the passive device embedded in an insulation layer disposed below the redistribution features. Therefore, while existing redistribution layers are adequate for its intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1-15 are fragmentary cross-sectional views of a workpiece with different configurations of top metal features and redistribution features according to embodiments of the present disclosure

DETAILED DESCRIPTION

Figure 1:
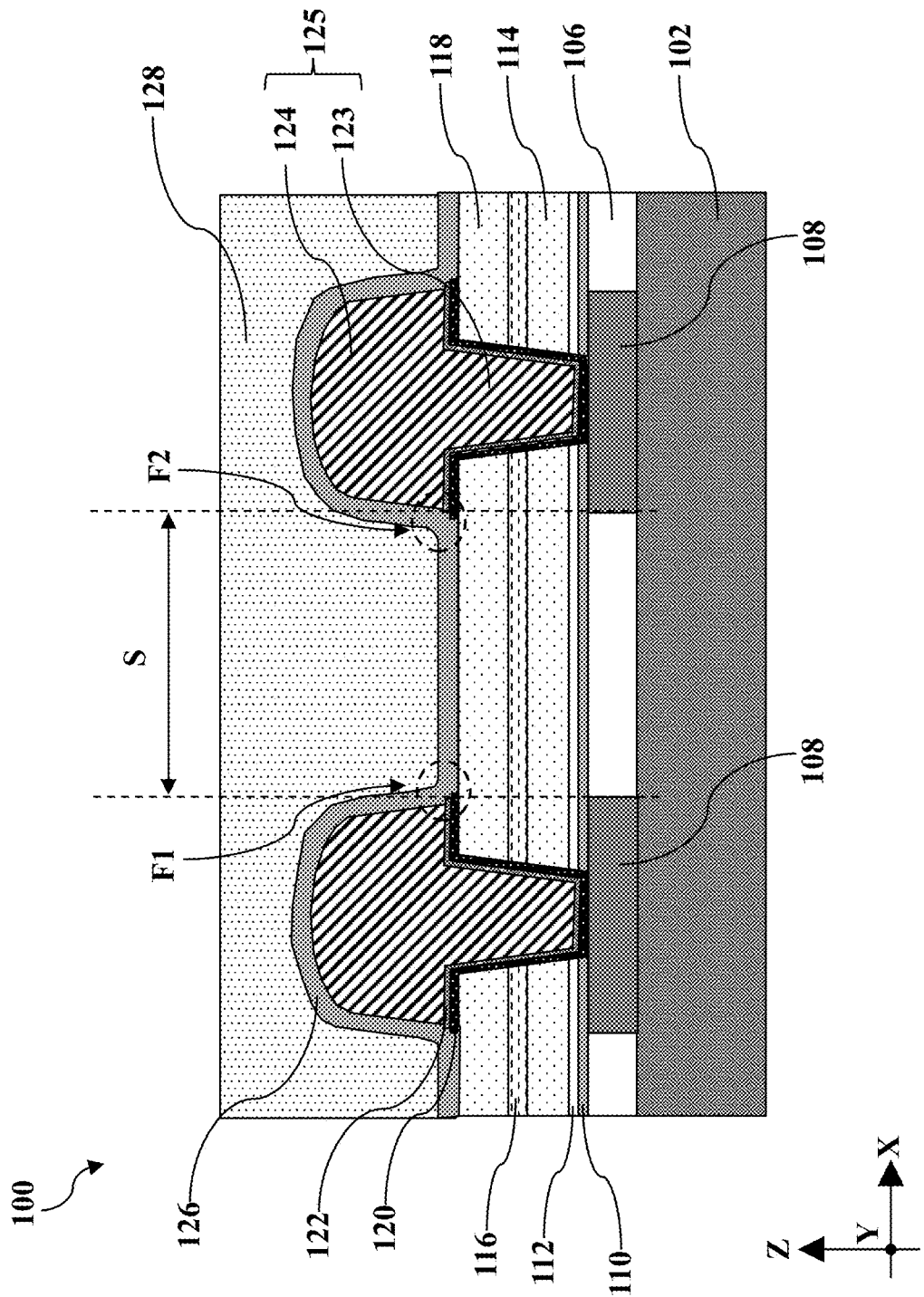

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In integrated circuit (IC) fabrication, a redistribution layer (RDL) refers to an additional metal layer over a die to route electrical connections to different locations. The redistribution features in the RDL are electrically coupled to top metal features in a top metal layer of an interconnect structure. The top metal layer and the RDL may be separated by an insulation structure and a passivation layer may be deposited over the redistribution features to provide electrical insulation. In some example existing processes, the passivation layer on a workpiece is formed of a dielectric material and is deposited at an elevated temperature between about 300° C. and about 450° C. At such elevated temperatures, the dielectric and metal features in the workpiece undergo different thermal expansion due to their different CTEs. When the workpiece is allowed to cool to room temperature, the metal features, such as the redistribution features and the top metal features, may shrink much more than the dielectric features, such as the passivation layer. The different amount of shrinkage creates stress at interfaces between metal features and dielectric features. It is observed that the stress may cause the passivation layer to peel or delaminate from surfaces of the redistribution features along the direction of the stress, resulting in cracks and defects. While some of the cracks and defects may not immediately manifest as device failures, they may result in inferior device lifetime or failure under stress.

The present disclosure provides methods to reduce stress in a passivation layer over redistribution features as well as semiconductor structures formed using such methods. It is observed in extensive simulations and experiments that having a top metal feature or a dummy metal feature at least partially below a space between two adjacent redistribution features may reduce the stress exerted on the passivation layer disposed between the two adjacent redistribution features. To suit different design needs or process limitations, the dummy metal features may have different configurations.

FIGS. 1-15 illustrate fragmentary cross-sectional views of a workpiece 100 that includes different configurations of top metal features and redistribution features. The configurations shown in FIGS. 1-15 are tested by experiments, observed on production lines, or validated by multiple simulations in the process of developing the embodiments of the present disclosure. In one aspect, the configurations shown in FIGS. 1-15 serve a basis of the method illustrated in FIG. 16. In another aspect, the configurations shown in FIGS. 1-15 indicate effective ways to insert dummy metal features to reduce stress in the passivation layer. For avoidance of doubts, throughout the present disclosure, like reference numerals denote like features. For that reasons, a feature having a reference numeral may only be described in detail once and the same description may not be repeated elsewhere in the present disclosure. FIGS. 17-29 illustrate various semiconductor structures that may be formed using the method in FIG. 16.

Reference is first made to FIG. 1. The workpiece 100 includes a substrate 102, a dielectric layer 106 disposed over the substrate 102, top metal features 108 (or TM metal features 108) embedded in the dielectric layer 106, a first etch stop layer (ESL) 110 over the dielectric layer 106, a second etch stop layer (ESL) 112 disposed over the first ESL 110, a first insulation layer 114 and a second insulation layer 118, a passive device 116 disposed between the first insulation layer 114 and the second insulation layer 118, redistribution features 125 (or RDL features 125), a passivation layer 126 disposed over the redistribution features 125, and a polymer layer 128 disposed over the passivation layer 126.

The substrate 102 may be made of silicon (Si) or other semiconductor materials, such as germanium (Ge) or silicon germanium (SiGe). In some embodiments, the substrate 102 may include a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as silicon germanium (SiGe), silicon phosphorus carbide (SiPC), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); other group III-V materials; other group II-V materials; or combinations thereof. Alternatively, substrate 102 is a semiconductor-on-insulator substrate, such as a silicon-on-insulator (SOI) substrate or a germanium-on-insulator (GeOI) substrate.

Various microelectronic components may be formed in or on the substrate 102. The various microelectronic components may include transistor components such as source/drain features, gate structures, gate spacers, source/drain contacts, gate contacts, isolation structures including shallow trench isolation (STI), or any other suitable components. Transistor components formed on the substrate 102 may include multi-gate devices, such as fin-type field effect transistors (FinFETs), multi-bridge-channel (MBC) transistors, or other FETs with nanostructures. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. Depending on the shape of the channel member that may resemble a wire or a sheet, an MBC transistor may also be referred to as nanowire transistors or nanosheet transistors.

While not explicitly shown in the drawings, the substrate 102 includes an interconnect structure over the various microelectronic components. The interconnect structure may include multiple patterned dielectric layers and conductive layers that provide interconnections (e.g., wiring) among the various microelectronic components of the workpiece 100. The multiple patterned dielectric layers may be referred to as intermetal dielectric (IMD) layers and may include silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. The conductive layers in the interconnect structure may include contacts, vias or metal lines. In semiconductor fabrication, the microelectronic components, such as transistors, may be referred to front-end-of-line (FEOL) features that are formed first. The contact features that are directly coupled to the microelectronic components, such as the gate contacts and source/drain contacts, may be referred to as middle-end-of-line (MEOL) features. The interconnect structure may be referred to as a back-end-of-line (BEOL) structure. The interconnect structure is functionally coupled to the FEOL features by way of the MEOL features. For ease of illustration, details of the FEOL features, MEOL features, and BEOL features are omitted from the drawings and are represented by the substrate 102.

The dielectric layer 106 disposed over the substrate 102 may include undoped silica glass (USG) or silicon oxide. In some embodiments, the dielectric layer 106 is between about 800 nm and about 1000 nm thick. The top metal features 108 are embedded in the dielectric layer 106. The top metal (TM) features 108 are disposed in a top metal layer. The top metal features 108 include a metal or metal alloy such as copper (Cu), cobalt (Co), nickel (Ni), aluminum (Al), or combinations thereof. In the depicted embodiment, each of the top metal features 108 include a metal fill layer formed of copper (Cu) or an aluminum-copper alloy (Al—Cu). In some embodiments not explicitly shown, each of the top metal features 108 may further include a barrier layer formed of titanium nitride (TiN), tantalum (Ta), titanium (Ti), tantalum nitride (TaN), or combinations thereof. The barrier layer is disposed at interfaces between the metal fill layer and the dielectric layer 106 to prevent electromigration of the metal fill layer and oxygen diffusion into the metal fill layer.

In some embodiments represented in FIG. 1, the first ESL 110 and the second ESL 112 are disposed over the dielectric layer 106 and the top metal features 108. To provide etch end point signals, the first ESL 110 and the second ESL 112 have different dielectric compositions. In some embodiments, the first ESL 110 is more etch-resistant than the second ESL 112. In one embodiment, the first ESL 110 includes silicon carbonitride or silicon nitride and the second ESL 112 includes silicon oxide or undoped silica glass (USG).

The first insulation layer 114 and the second insulation layer 118 may be formed of silicon nitride. The first insulation layer 114 and the second insulation layer 118 may be collectively referred to as an insulation structure. The passive device 116 is disposed between the first insulation layer 114 and the second insulation layer 118. That is, the passive device 116 is embedded in the insulation structure that includes the first insulation layer 114 and the second insulation layer 118. The passive device 116 may include a resistor, a capacitor or a diode. In the depicted embodiments, the passive device 116 may include a metal-insulator-metal (MIM) capacitor. When the passive device 116 is an MIM capacitor, it may include a bottom conductor plate, a middle conductor plate, and a top conductor plate that are spaced apart by various insulator layers. In some instances, the bottom conductor plate, the middle conductor plate and the top conductor plate may include titanium (Ti), titanium nitride (TiN), tantalum nitride (TaN), tantalum (Ta), copper (Cu), or a combination thereof. The insulator layers may be formed of high-k dielectric material(s) that have a dielectric constant greater than that of silicon oxide. In some embodiments, the insulator layers in the passive device 116 may include zirconium oxide, aluminum oxide, or hafnium oxide.

The workpiece 100 also includes redistribution features 125, or RDL features 125. As shown in FIG. 1, each of the redistribution features 125 includes a via portion 123 and a line portion 124 disposed over the via portion 123. The via portion 123 extends through the second insulation layer 118, the passive device 116, the first insulation layer 114, the second ESL layer 112, and the first ESL layer 110 to come in contact with the underlying top metal feature 108. The bulk of the redistribution features 125, including the via portion 123 and the line portion 124, may be formed of copper (Cu), aluminum (Al), or an aluminum-copper alloy. To reduce electromigration and oxygen diffusion, the redistribution features 125 include a barrier layer 120 to interface the first insulation layer 114, the second insulation layer 118, the insulator layers of the passive device 116, the second ESL 112, and the first ESL 110. In some embodiments, the barrier layer 120 may include titanium nitride (TiN) or tantalum nitride (TaN). In one embodiment, the barrier layer 120 is formed of tantalum nitride (TaN). In some embodiments where the bulk of the redistribution feature 125 is formed using electroplating or electroless plating, the redistribution features 125 may also include a seed layer 122. The seed layer 122 may include titanium (Ti), cobalt (Co) or copper (Cu). In one embodiment, the seed layer 122 may be formed of copper (Cu). Because the redistribution features 125 are patterned after the barrier layer 120, the seed layer 122, and a bottom-up bulk layer are deposited over the workpiece 100, a portion of the barrier layer 120 and a portion of the seed layer 122 are sandwiched between a portion of the line portion 124 and a top surface of the second insulation layer 118.

The surfaces of the line portions 124 of the redistribution features 125 are conformally covered by a passivation layer 126. It is noted that the passivation layer 126 extends along the top surface of the second insulation layer 118 and continues substantially vertically along sidewalls of the line portions 124 that rise above the top surface of the second insulation layer 118. In one embodiment, the passivation layer 126 may include silicon nitride. The polymer layer 128, which may be deposited using spin-on coating, is disposed over the passivation layer 126 to fill the space between two adjacent redistribution features 125. The polymer layer 128 may be formed of a polymeric material, such as polyimide.

In the configuration shown in FIG. 1, when viewed along the Y direction, each of the top metal features 108 is disposed directly below one of the redistribution features 125. Along the X direction, edges of the redistribution feature 125 (at a bottom of the line portion 124) are substantially coterminous with edges of the underlying top metal features 108. In other words, edges of the redistribution feature 125 (at a bottom of the line portion 124) are substantially aligned with edges of the underlying top metal features 108 along the Z direction. As shown in FIG. 1, the line portions 124 are spaced apart by a spacing S, which is defined by the smallest distance between two adjacent redistribution features 125. In this configuration, the space between the two redistribution features 125 is not disposed over any portion of the top metal features 108.

During the fabrication process of the semiconductor structure shown in FIG. 1, after the passivation layer 126 is deposited at an elevated temperature between about 300° C. and about 450° C., the entire workpiece 100 is allowed to cool to room temperature. Because the CTEs of the metal features (including the top metal features 108 and the redistribution features 125) are much greater than those of the dielectric materials (the passivation layer 126, the first insulation layer 114, and the second insulation layer 118), the metal features would contract much more than the dielectric features. For references, silicon nitride has a CTE of about 3.2 ppm/° C., USG has a CTE of about 0.5 ppm/° C., silicon has a CTE between about 2.6 ppm/° C. and about 3.4 ppm/° C., silicon carbonitride has a CTE of about 3 ppm/° C., copper (Cu) has a CTE between about 16 ppm/° C. and about 18 ppm/° C., titanium nitride (TiN) has a CTE between about 6.2 ppm/° C. and about 7.2 ppm/° C., and polyimide has a CTE of about 45 ppm/° C. With the redistribution features 125 and the top metal features 108 contracting and pulling away from the space between the two redistribution features 125, the passivation layer 126 between the two redistribution features 125 would be subject to a tensile stress. When the tensile stress is strong enough, the passivation layer 126 may delaminate or be peeled away from sidewalls of the line portions 124. In the configuration shown in FIG. 1, the contraction of the top metal features 108 also exert a tensile stress on the insulation structure between the two redistribution features 125, which may only exacerbate the delamination or peeling. The delamination or peeling may develop into cracks that propagate through the second insulation layer 118 or even the passive device 116, causing device failure. Experimental results and simulation results show that the stress is at its maximum near the first point F1 and the second point F2, where horizontal portions of the passivation layer 126 meet vertical portions of the passivation layer 126. It is observed that stress levels at the first point F1 and the second point F2 are reliable indicator of likeliness of occurrence of delamination of the passivation layer 126 or cracks that result from the delamination. Because CTE is a bulk property, the amount of contraction increase with the dimension of the redistribution feature. A wider redistribution feature can cause greater tensile stress on the passivation layer 126 than a narrower one, leading to likely failures.

Figure 2:
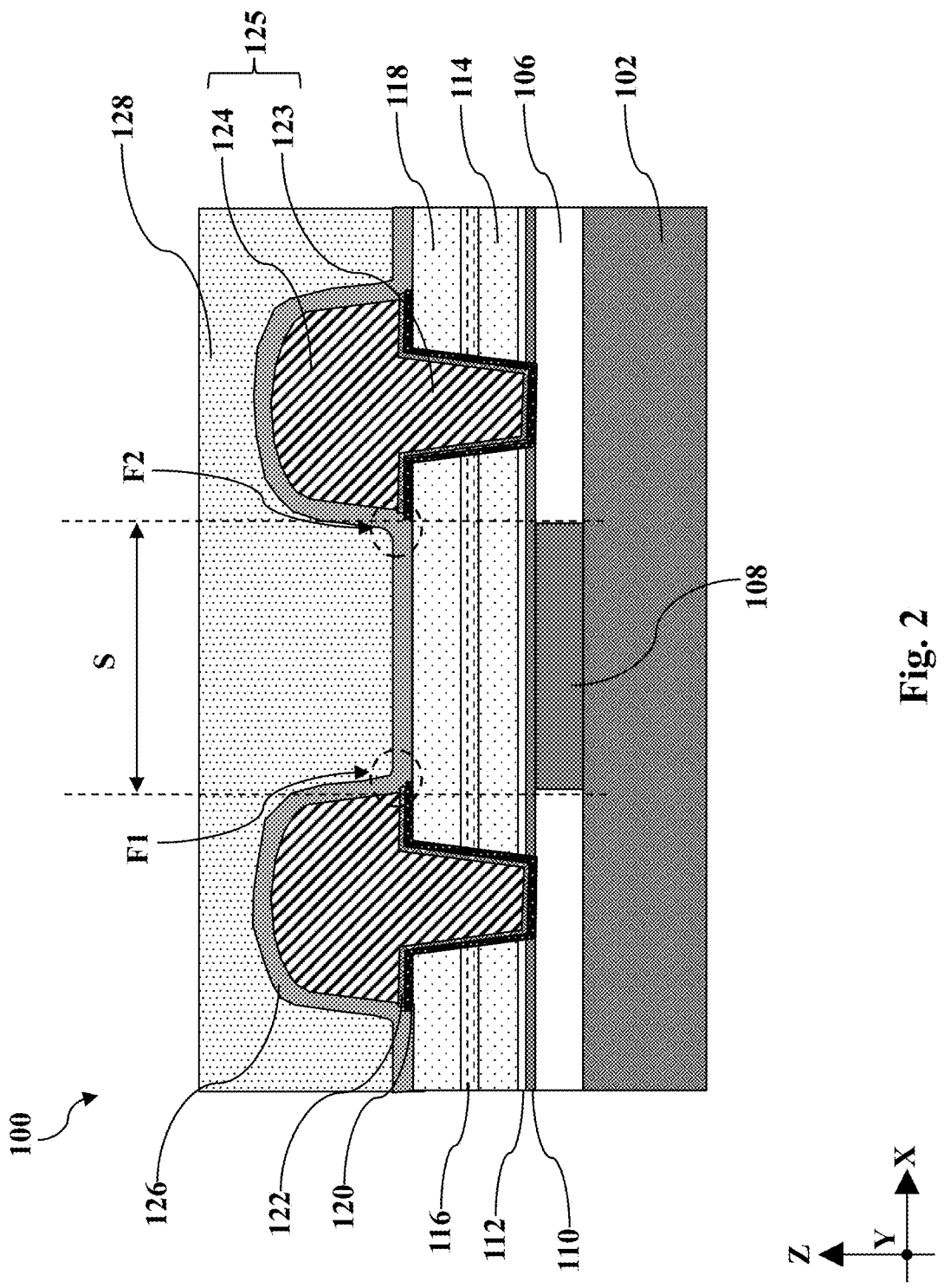

FIG. 2 includes a fragmentary cross-sectional view of the workpiece 100 in a different configuration. In the workpiece 100 shown in FIG. 2, the top metal feature 108 is disposed directly below the space between the two adjacent redistribution features 125. Put differently, along the X direction, a width of the top metal feature 108 in FIG. 2 is substantially equal to the spacing S. When viewed along the Y direction, edges of the top metal feature 108 and edges of the redistribution features 125 are vertically aligned along the Z direction. In the configuration shown in FIG. 2, when the workpiece 100 is allowed to cool down from about 300° C. and about 450° C. to room temperature, the contraction of the top metal feature 108 exerts a compressive stress to the insulation structure directly under the space. Experimental results and computer simulations show that this compressive stress may at least partially cancel out the tensile stress caused by the contraction of the redistribution features 125. As a consequence, the tensile stress that may peel the passivation layer 126 from sidewalls of the line portions 124 may be reduced by the compressive stress from the top metal feature 108. As will be discussed further below, this stress reduction may be in the range between 10% and about 40%.

Extensive simulations and experiments have been conducted to aid the understanding of the stress cancelation mechanism described above with respect to FIGS. 1 and 2. For example, configurations shown in FIGS. 3-7 indicate that when at least a portion of the top metal feature 108 is disposed directly below the space between two redistribution features 125, the tensile stress exerted on the passivation layer 126 can be reduced. Additionally, configurations shown in FIGS. 3-7 also indicate that when the space between two redistribution features 125 is not disposed directly over any portion of the top metal feature 108, the tensile stress is smaller when an edge of the top metal feature 108 is farther away from a vertical projection of the space (shown as the spacing S). Configurations shown in FIGS. 8-15 indicate that insertion below the space of dummy metal features in any shape and form help reduce the tensile stress exerted on the passivation layer 126. As used herein, dummy metal features or dummy metal fragments (to be described below) refer to dummy metal features that are not electrically coupled to any conductive features in the underlying interconnect structure. Because dummy metal features or dummy metal fragments (to be described below) are not electrically coupled to the interconnect structure, they are not electrically coupled to transistors or active devices disposed below the interconnect structure. Configurations shown in FIGS. 8-15 also indicate that when more of the dummy metal feature is inserted below the space between two redistribution features, the tensile stress may be reduced further.

There are several considerations in placement and areal coverage of the top metal features 108 or the dummy metal features. For example, unless the design specifically calls for it, a top metal feature 108 or a dummy metal feature cannot short two adjacent redistribution features 125. In embodiments where the passive device 116 includes an MIM capacitor, adjacent via portions 123 may be electrically coupled to different conductor plate(s) in the MIM capacitor. Allowing two adjacent redistribution features 125 to short will lead to failure of the MIM capacitor. For another example, spacing between two adjacent top metal features 108 may not be too small. In some instances, the top metal features 108 are formed by depositing conductive material into trenches formed in the dielectric layer 106. When two trenches are too close to one another, the portion of the dielectric layer 106 between two trenches may be become too thin. If the thin portion collapses or is damaged before or during the deposition of the conductive materials, the two adjacent top metal features may be shorted together, leading to circuit failures. Additionally, when two top metal features are disposed close to one another, cross-talk between these two top metal features may take place. For another example, it is observed that the metal coverage in the top metal layer cannot be too high. When the metal coverage in the top metal layer is too high, the CTE mismatch may reach a point where the entire wafer is warped due to the collective contraction of the top metal features and dummy metal features in the top metal layer.

Figures 6, 7:
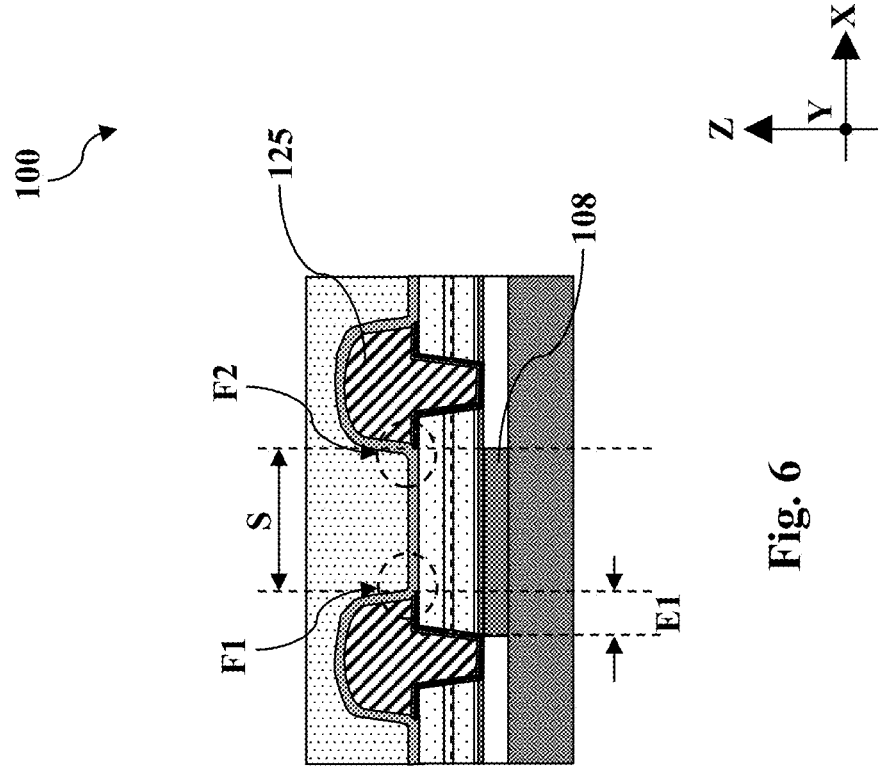

Referring to FIG. 3, simulation results demonstrate that the tensile stress at the second point F2 is smaller than that at the first point F1 because the left-hand-side top metal feature 108 is a first gap G1 away from the vertical projection of the space while an edge of the right-hand-side top metal feature 108 is vertically aligned with an edge of the space. Referring to FIG. 4, simulation results show that when the greater first gap G1 is reduced to a smaller second gap G2, the tensile stresses at the first point F1 and the second point F2 become greater than when the edge of the top metal feature 108 is the first gap G1 away from the edge of the space. Referring to FIG. 5, simulation results show that any vertical overlapping OL between the top metal feature 108 and the spacing S leads to a greater reduction of tensile stress. Reference is now made to FIGS. 6 and 7, simulation results indicate that if the top metal feature 108 extend from outside the vertical projection of the space into the vertical projection of the space to enclose the first point F1 or the second point F2, the tensile stress can be greatly reduced. In FIG. 6, the top metal feature 108 may not be electrically coupled to both of the redistribution features 125 at the same time. The amount the top metal feature 108 extends into a region under an redistribution feature 125 may be referred to as enclosure. FIG. 6 illustrates a first enclosure E1 and FIG. 7 illustrates the first enclosure E1 and a second enclosure E2 smaller than the first enclosure E1. It is observed that a greater enclosure leads to a smaller stress. For example, in FIG. 7, the stress at the first point F1 is smaller than that at the second point F2.

Figure 11:
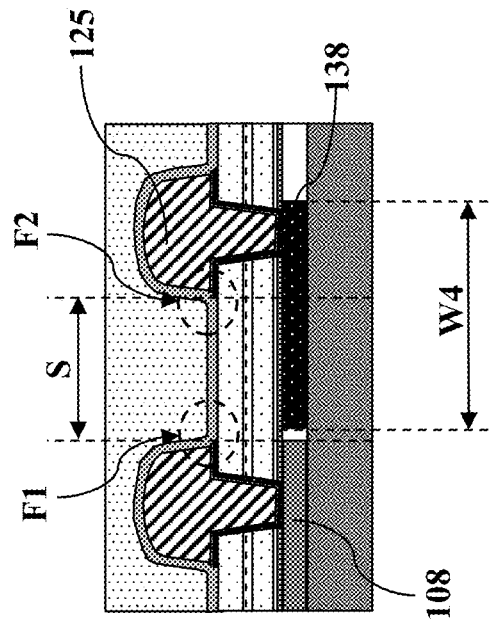
Figure 12:
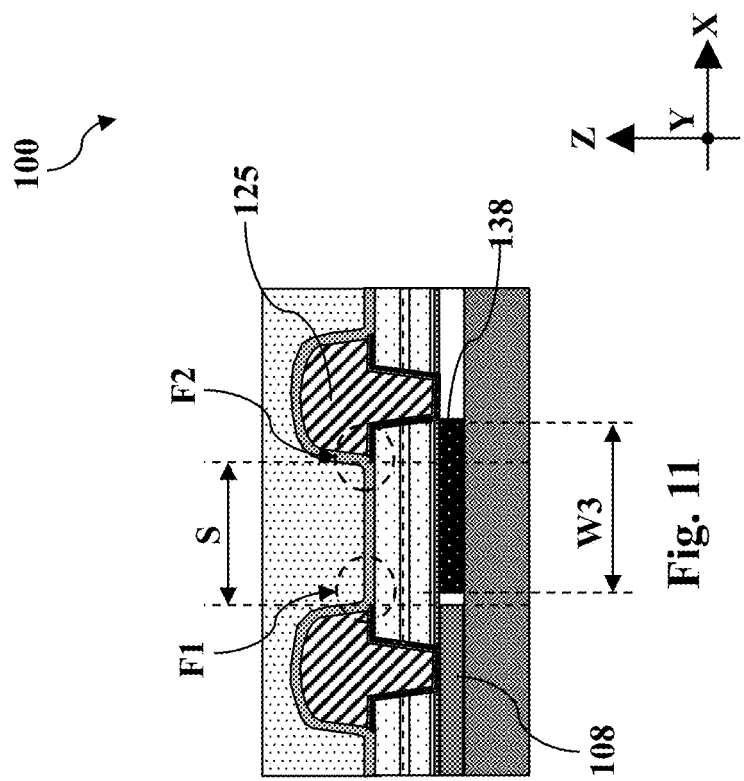

The configuration shown in FIG. 8 serves as a baseline for configurations shown in FIGS. 9-15 where a dummy metal feature 138 or uniform dummy metal fragments 148 are implemented. In FIG. 8, the workpiece 100 includes a top metal feature 108 with an edge that is vertically aligned with the left-hand-side edge of the space. Put differently, the edge of the top metal feature 108 is directly below the first point F1. Referring to FIG. 9 where a dummy metal feature 138 is inserted in the top metal layer and below the space. The dummy metal feature 138 in FIG. 9 has a first width W1 substantially smaller than the spacing S. Simulation results show that, despite the smaller first width W1, the implementation of the dummy metal feature 138 may reduce the tensile stress on the passivation layer 126. The dummy metal feature 138 in FIG. 10 has a second width W2 smaller than the spacing S but greater than the first width W1 in FIG. 9. Simulation results show that the wider dummy metal feature 138 in FIG. 10 may reduce the tensile stress more than the narrower one shown in FIG. 9. Referring to FIG. 11, the dummy metal feature 138 has a third width W3 that is greater than the spacing S such that one edge of the dummy metal feature 138 is directly below the first point F1 and the other edge of the dummy metal feature 138 extends below the redistribution feature 125. That is, the second point F2 is enclosed by the dummy metal feature 138 in FIG. 11. Simulation results show that the even wider dummy metal feature 138 in FIG. 11 may reduce the tensile stress more than the one shown in FIG. 10. The configuration shown in FIG. 12 pushes the enclosure further to have a fourth width W4 greater than the third width W3 in FIG. 11 and the simulation results demonstrate that the dummy metal feature 138 in FIG. 12 reduces the tensile stress more than the one shown in FIG. 11.

Considering that wider dummy metal feature 138 may inadvertently short two redistribution features and increase metal coverage in the top metal layer, alternative configurations are also explored. In some embodiments, uniform dummy metal fragments 148 may be implemented. As used here, dummy metal features refer to an array of elongated metal fragments that extend parallel to one another. Because the dummy metal fragments are separated from one another, dummy metal fragments may be disposed below the space without running the risk of electrically coupling two adjacent redistribution features 125. FIGS. 13-15 illustrate cross-sectional views of the workpiece 100 where uniform dummy metal fragments 148 are inserted in the top metal layer. In the embodiments shown in FIGS. 13-15, each of the dummy metal fragments 148 extends lengthwise along the Y direction and has a uniform fifth width W5 along the X direction. The uniform dummy metal fragments 148 are arranged at a uniform pitch P. In FIG. 13, an edge of one of the uniform dummy metal fragments 148 is vertically aligned with the first point F1. In FIG. 14 and FIG. 15, the edge of uniform dummy metal fragment 148 is shifted by a smaller first offset OS1 or a greater second offset OS2, respectively. Experiments and simulations show that the uniform dummy metal fragment 148 may reduce the tensile stress exerted on the passivation layer 126 and the alignment or offsetting illustrated in FIGS. 13-15 do not affect the efficacy of the uniform dummy metal fragment 148 much. Besides reducing the risk of shorts, uniform dummy metal fragments 148 shown in FIGS. 13-15 tend to allow uniform distribution of metal features below spaces between two adjacent redistribution features 125.

Figure 16:
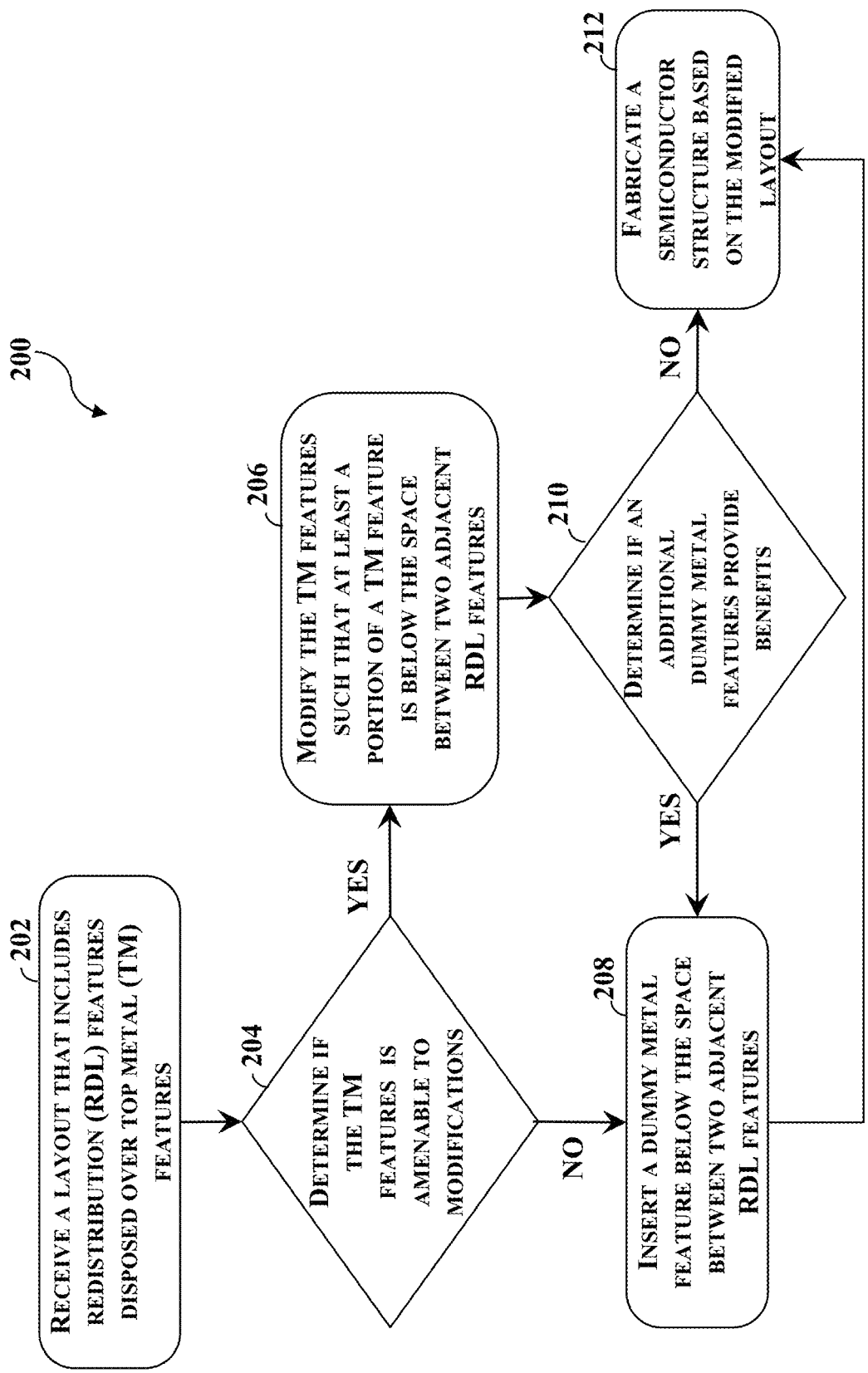
FIG. 16 is a flow chart of a method for reducing cracks in passivation layers in accordance with embodiments of the present disclosure.

FIG. 16 illustrates a method 200 for reducing stress or cracks in the passivation layer. The method 200 may be implemented as one or more design rules for modifying a layout to obtain a modified layout. Referring to FIG. 16, the method 200 includes a block 202 where a layout is received. The layout includes redistribution features (or RDL features) disposed over top metal (TM) features, similar to those shown in FIGS. 1 and 2. The method 200 includes a block 204 that determines if the top metal features in the layout is amenable to modifications. When the top metal features in the layout is amenable to modifications, the layout is modified such that at least a portion of the top metal feature is disposed directly below the space between two adjacent redistribution features at block 206. After the modification of the TM features in the top metal layer, method 200 determines if additional dummy features can provide benefits at block 210. In other words, at block 210, method 200 weighs the benefits associated with adding additional dummy features and costs associated with such addition. For example, when TM features can also only be moderately modified to reduce risks of crosstalk due to close proximity, adding additional dummy features may reduce the stress without increasing the risks of crosstalk. In this situation, block 210 would determine that additional dummy features can provide benefits. For another example, when the modification of the TM features also reduces the stress and there is little room to add additional dummy features, adding additional dummy features may increase the risk of cross talk or even shorts because the additional dummy features may contact the TM features. In this latter situation, block 210 would determine that additional dummy features cannot provide benefits. When additional dummy metal features can provide benefits, the method 200 may proceed to block 208 where dummy metal features are inserted in the top metal layer. When the top metal features in the layout is not amenable to modifications, a dummy metal feature may be inserted below the space to reduce stress exerted on the passivation layer 126 at block 208. The modification of the top metal layer at block 206 and/or the insertion of a dummy metal feature at block 208 may result in a modified layout. The method 200 further includes a block 212 where a semiconductor structure is fabricated based on the modified layout.

At block 204, method 200 makes the determination in consideration of, for example, metal coverage in the top metal layer in the layout, spacing between two adjacent top metal features, and landing of an overlying via portion of a redistribution feature on a top metal feature. When modifying the top metal features in the top metal layer may cause wafer warpage, increase probability of shorts, or increase possibility of cross talks of two adjacent top metal features, the determination at block 204 is that the top metal features are not amenable to modifications.

At block 206, the top metal features may be shifted in the top metal layer while maintaining the same electrical connection. Additionally, the top metal features may be widened or lengthened to be inserted below more inter-RDL-feature spaces.

At block 208, method 200 may insert different types of dummy metal features. For example, when the metal coverage in the top metal layer is low, wider dummy metal features may be inserted in the top metal layer to reduce stress in the passivation layer. When the metal coverage in the top metal layer approaches a critical metal coverage value, narrow dummy metal features or dummy metal fragments may be inserted in the top metal layer to reduce stress, while keeping the metal coverage in check. When risk of electrical shorts is a concern, dummy metal fragments may be inserted. When certain redistribution features are much larger than the other redistribution features, dummy metal features or dummy metal fragments may be inserted with greater enclosures around these larger redistribution features. Because larger redistribution features may lead to greater tensile stress and higher risk of cracks, an intentional bias toward these larger redistribution features may more efficiently reduce the risk of failure. Some example dummy metal features or dummy metal fragments inserted at block 208 are described below.

Figure 17:
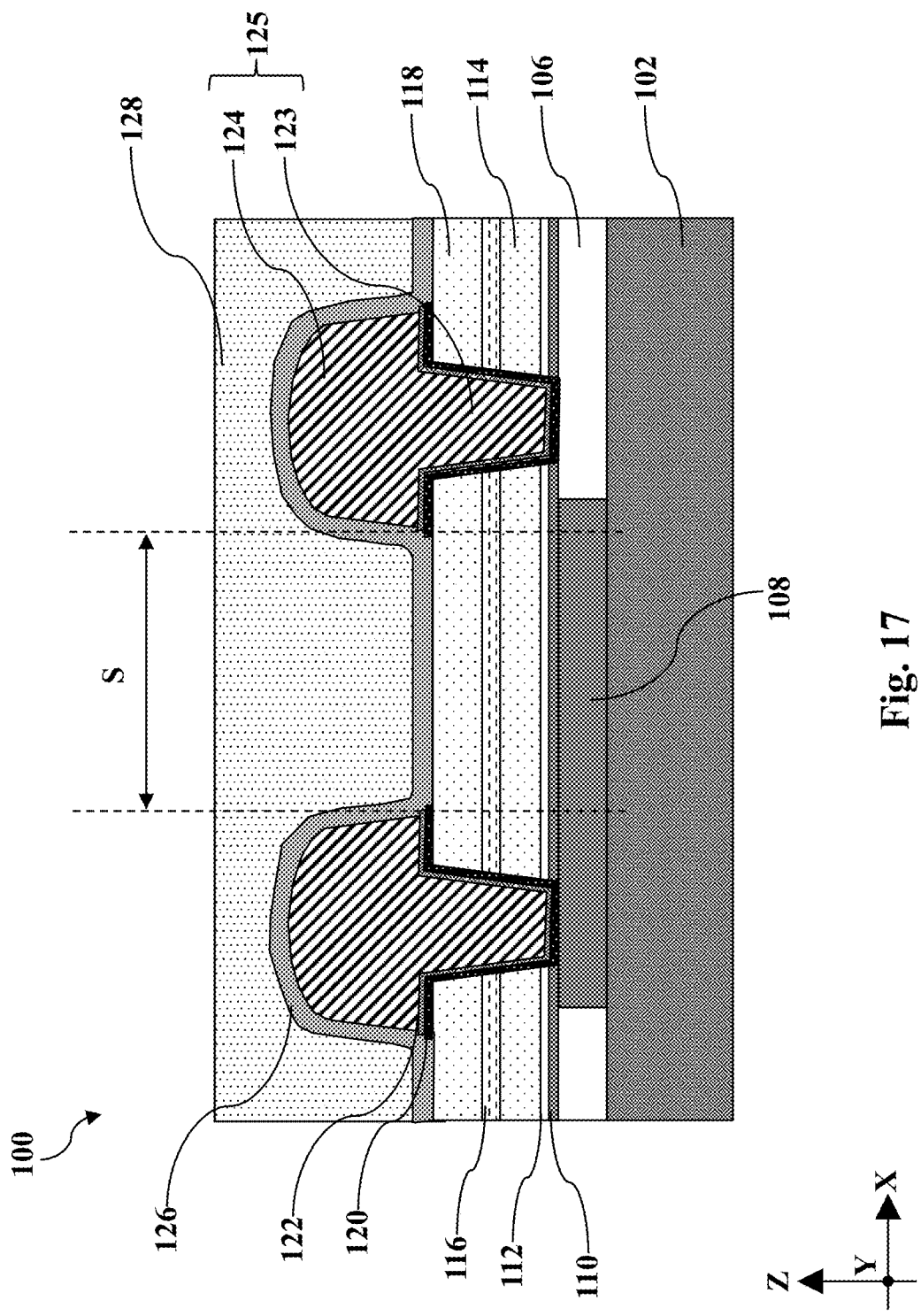
FIGS. 17-29 are fragmentary cross-sectional or top views of a workpiece formed using the method of FIG. 16, according to embodiments of the present disclosure.
Figure 18:
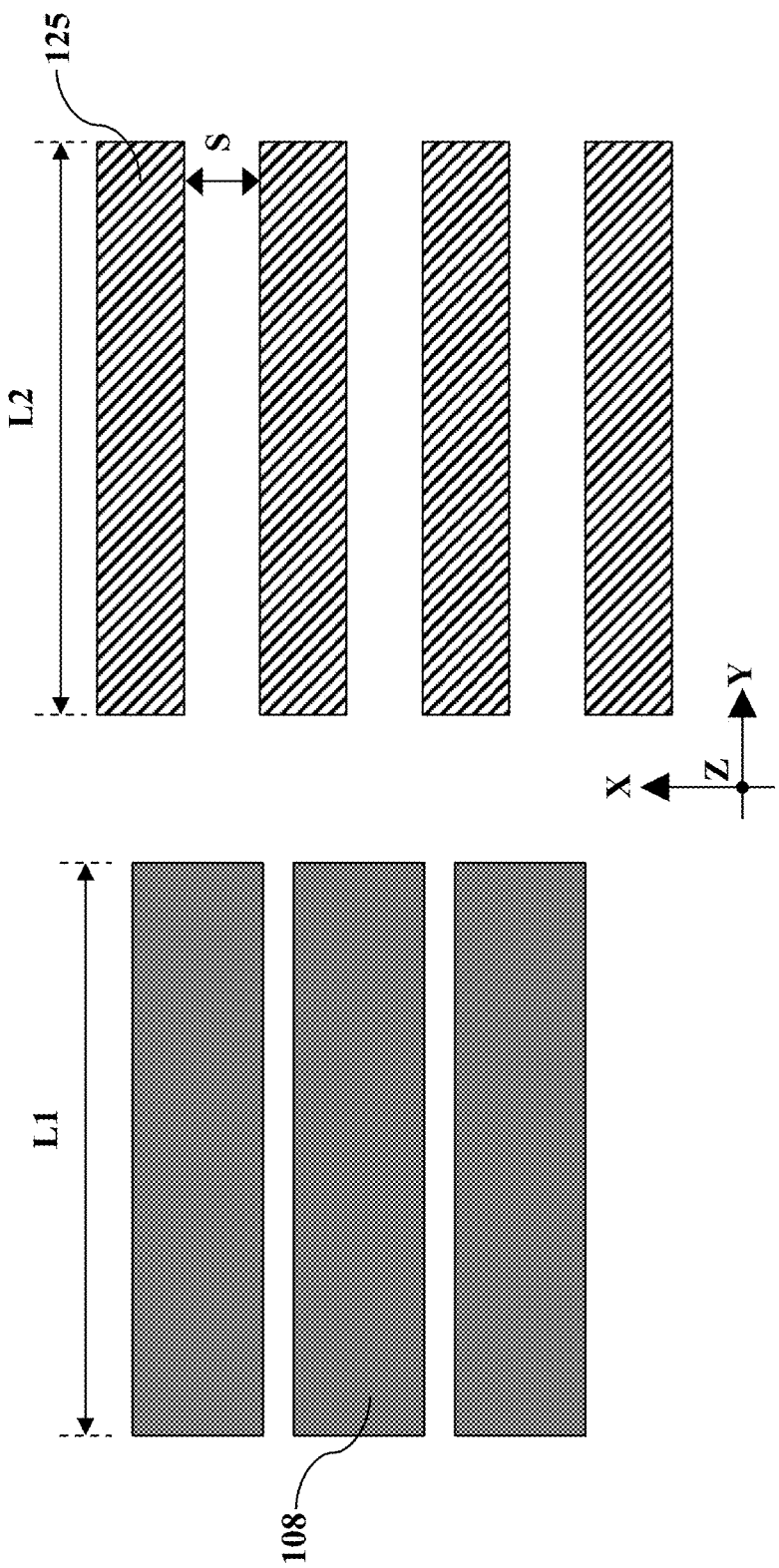

FIGS. 17-29 illustrate fragmentary cross-sectional views or fragmentary schematic top views of the workpiece 100 that are formed using the method 200 in FIG. 16. Reference is first made to FIG. 17, which is a fragmentary cross-sectional view of a workpiece 100. The top metal layer in the layout may be modified such that a top metal feature 108 is electrically coupled to one of the redistribution feature 125 and also extends partially below the other redistribution feature 125. It is noted that the top metal feature 108 is spaced apart from a via portion of one of the two redistribution features 125. With the modification, the top metal feature 108 in FIG. 17 spans completely over the space between the two redistribution features 125. FIG. 18 illustrates top views of the top metal feature 108 and the overlying redistribution features 125 in a side-by-side fashion. In some embodiments shown in FIG. 18, both the top metal features 108 and the redistribution features 125 extend lengthwise along the Y direction. Each of the top metal features 108 includes a first length L1 and each of the redistribution features 125 includes a second length L2. In some embodiments, the first length L1 is substantially identical to the second length L2 to ensure satisfactory stress cancelation. When other design rules prevent the first length L1 from being equal to the second length L2, the first length L1 should be made greater than the second length L2 whenever possible.

Figure 19:
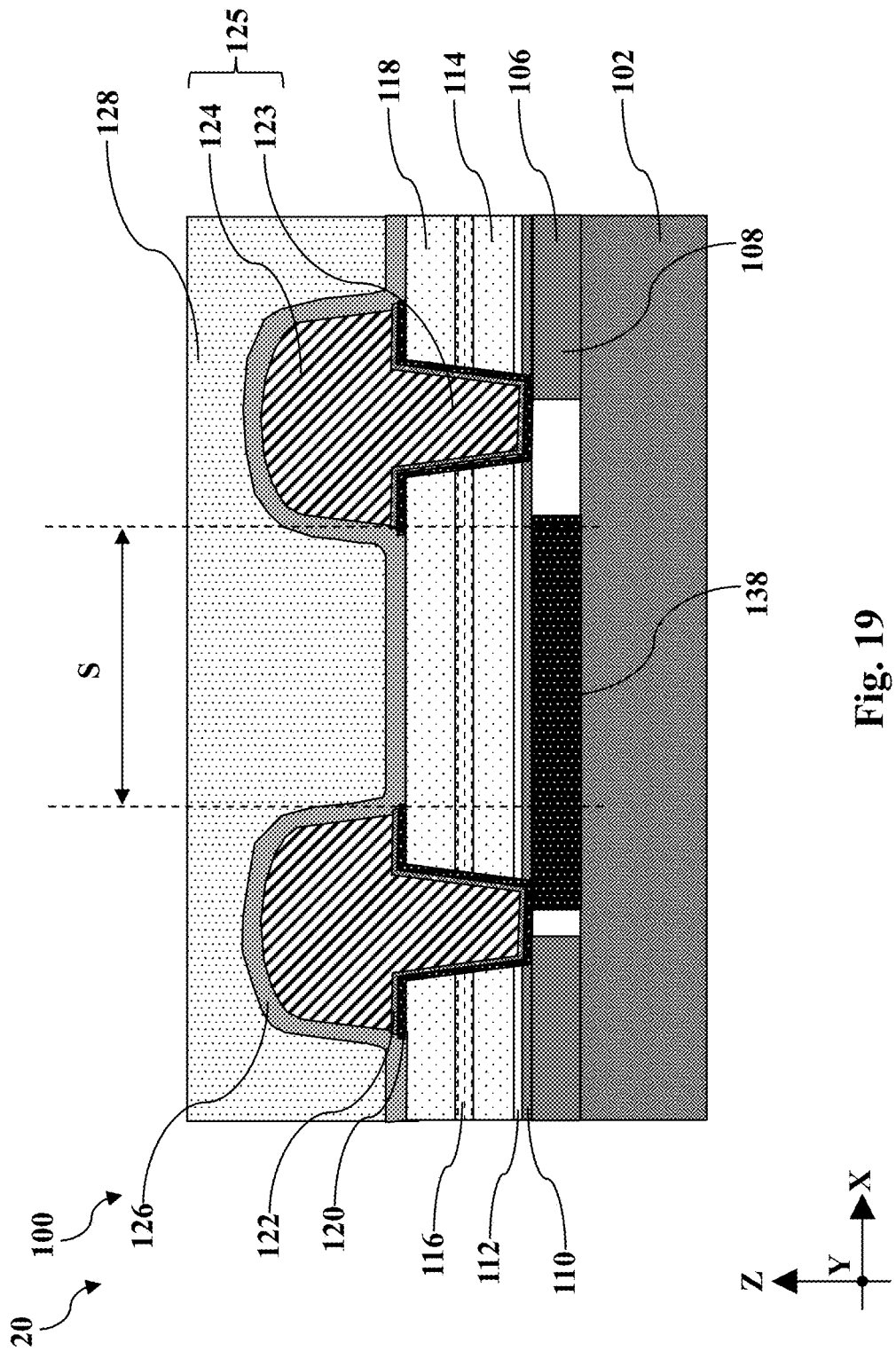
Figure 20:
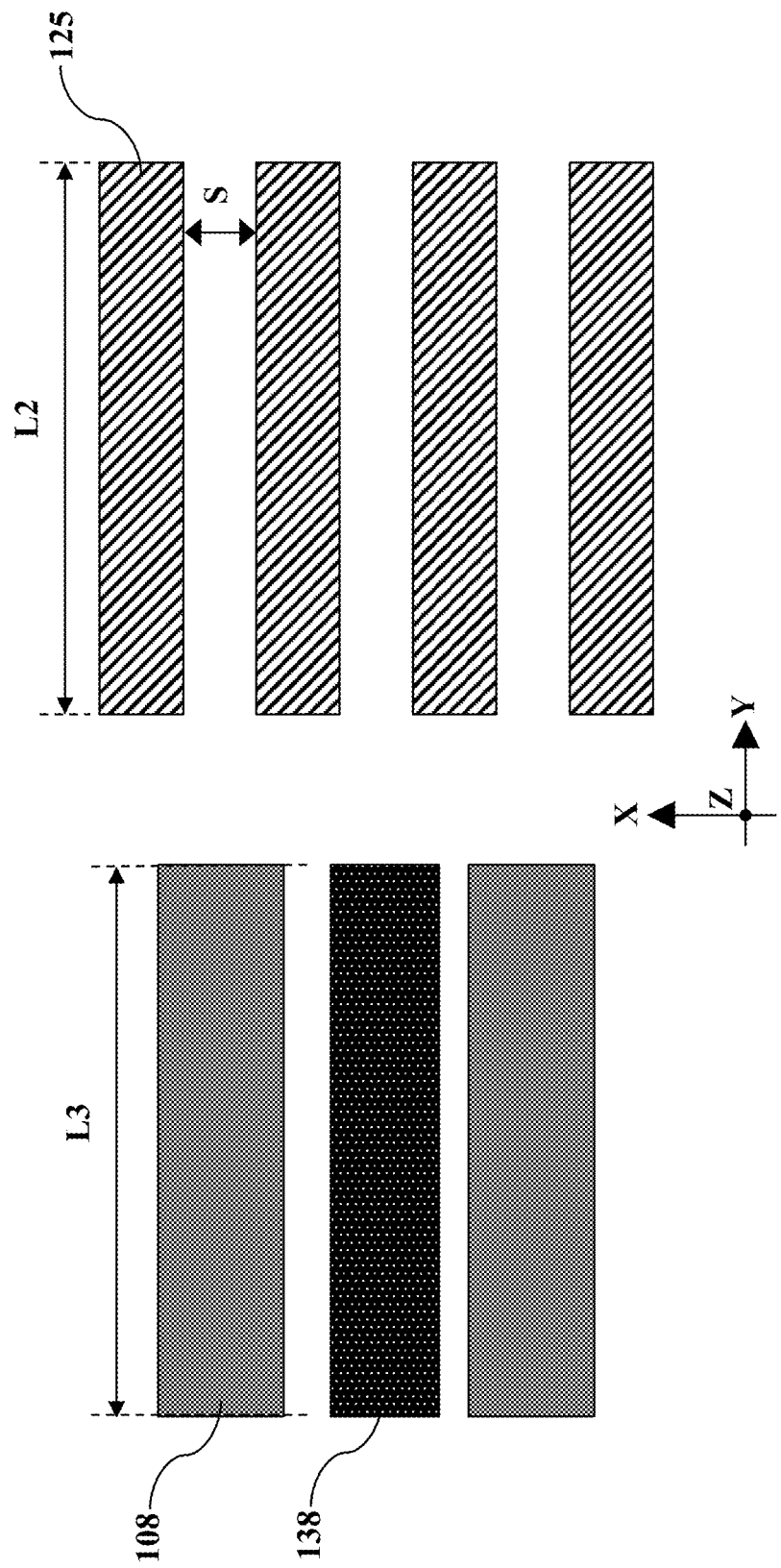

Reference is made to FIG. 19, which is a fragmentary cross-sectional view of a workpiece 100. When the top metal layer in the layout cannot be modified, a dummy metal feature 138 is inserted in the top metal layer below the space as shown in FIG. 19. When fabricated into a semiconductor structure, the dummy metal feature 138 in FIG. 19 spans completely over the space between the two redistribution features 125. To prevent undesirable electrical connection, the dummy metal feature 138 cannot contact the via portions of the two redistribution features 125 at the same time. Similarly, the dummy metal feature 138 cannot contact two adjacent top metal features 108 at the same time. Conversely, the dummy metal feature 138 may be in contact with just one top metal feature 108 or just one redistribution feature 125. FIG. 20 illustrates top views of the dummy metal feature 138 and the overlying redistribution features 125 in a side-by-side fashion. As shown in FIG. 20, the top metal features 108, the dummy metal feature 138, and the redistribution features 125 extend lengthwise along the Y direction. The dummy metal feature 138 includes a third length L3 and each of the redistribution features 125 includes the second length L2. In some embodiments, the third length L3 is substantially identical to the second length L2 to ensure satisfactory stress cancelation. When other design rules prevent the third length L3 from being equal to the second length L2, the third length L3 should be made greater than the second length L2 whenever possible.

Figure 21:
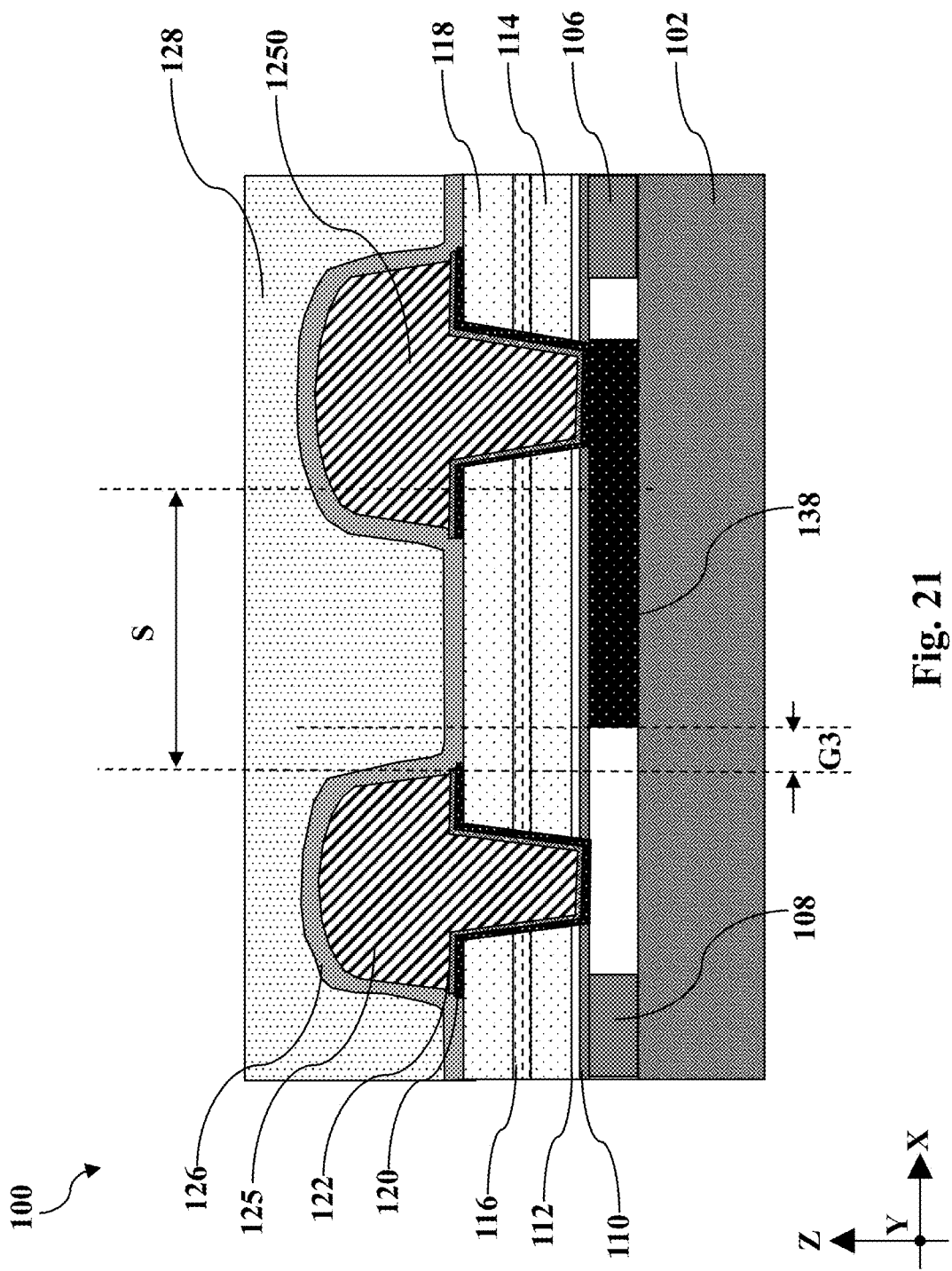
Figure 22:
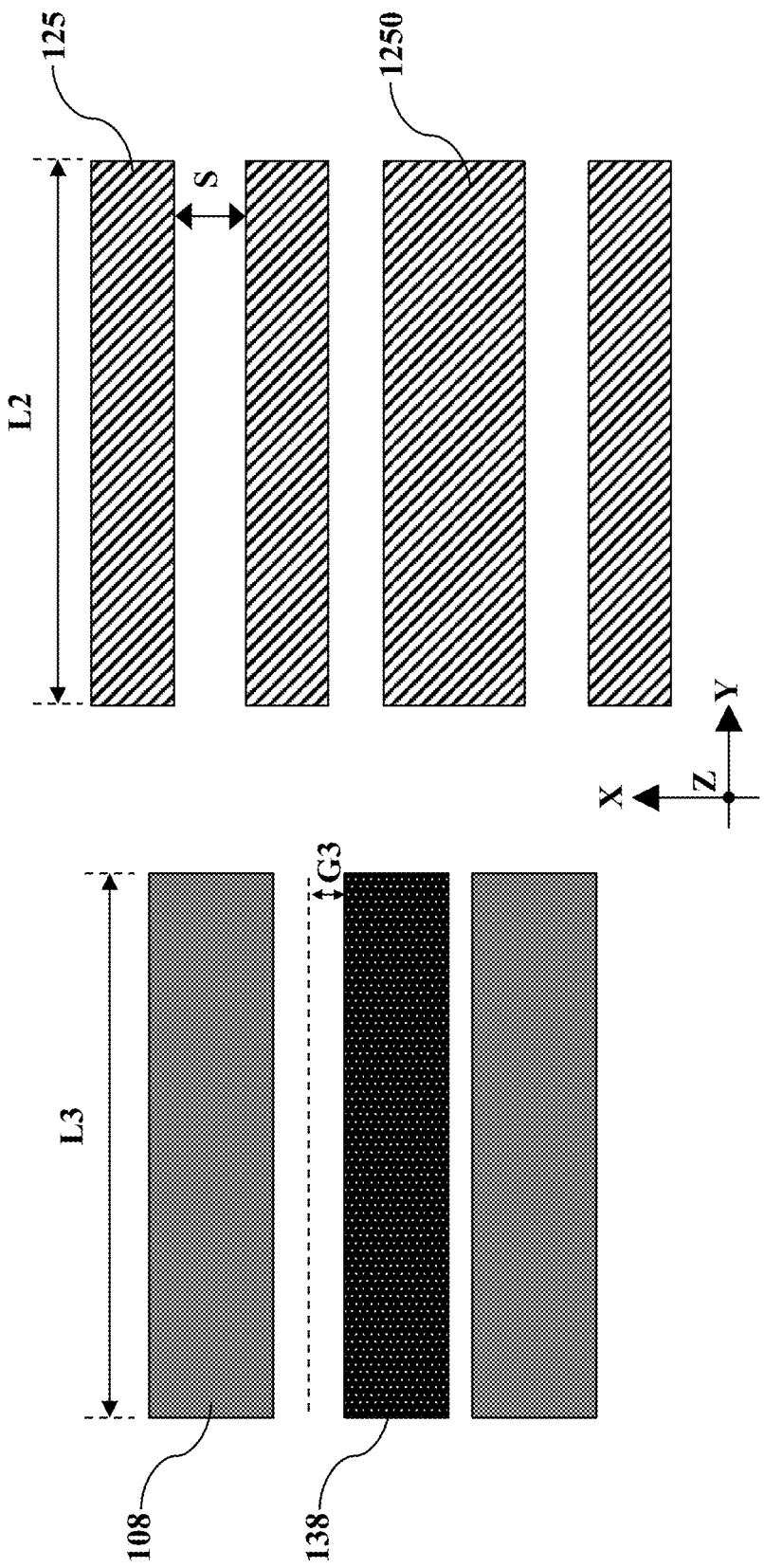

Reference is now made to FIG. 21, which is a fragmentary cross-sectional view of a workpiece 100. When the top metal layer in the layout cannot be modified and certain top metal features are of different dimensions, a dummy metal feature 138 is inserted in the top metal layer as shown in FIG. 21. When fabricated, the dummy metal feature 138 extends below a wide redistribution features 1250 on the right-hand side but does not extend below the redistribution features 125 on the left-hand side. As shown in FIG. 21, the dummy metal feature 138 is spaced apart from the redistribution feature 125 by a third gap G3 but encloses the wide redistribution feature 1250. This biased configuration may be implemented because the wide redistribution feature 1250 is wider (along the X direction) than the redistribution feature 125. This right-heavy bias allows the dummy metal feature 138 to provide stress-cancellation where the wide redistribution feature 1250 creates greater tensile stress on the passivation layer. FIG. 22 illustrates top views of the dummy metal feature 138 and the overlying redistribution features 125 (and the wide redistribution feature 1250) in a side-by-side fashion. As shown in FIG. 22, both the dummy metal feature 138 and the redistribution features 125 (and the wide redistribution feature 1250) extend lengthwise along the Y direction. The dummy metal features 138 includes a third length L3 and each of the redistribution features 125 includes a second length L2. In some embodiments, the third length L3 is substantially identical to the second length L2 to ensure satisfactory stress cancelation. When other design rules prevent the third length L3 from being equal to the second length L2, the third length L3 should be made greater than the second length L2 whenever possible.

Figure 23:
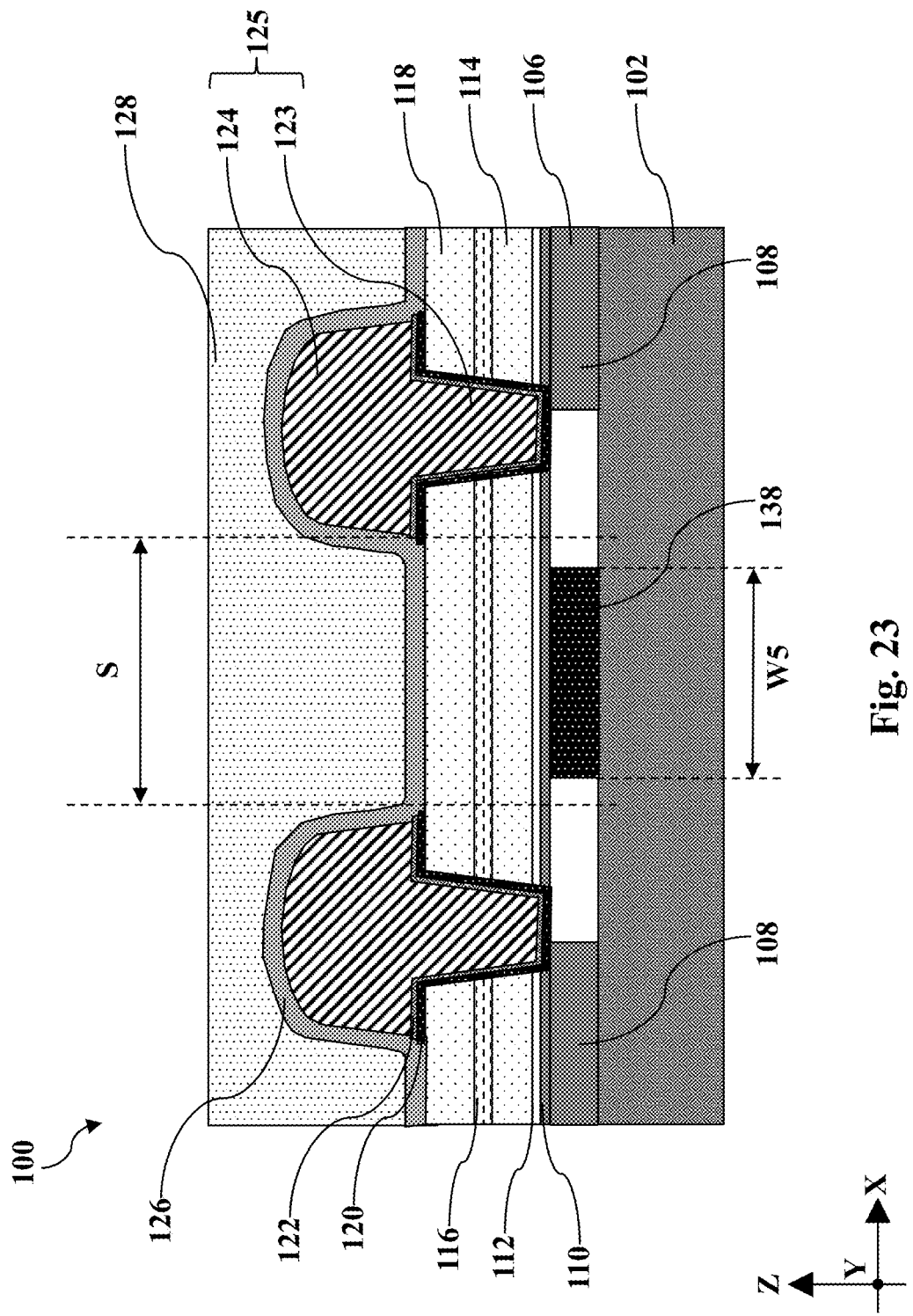
Figure 24:
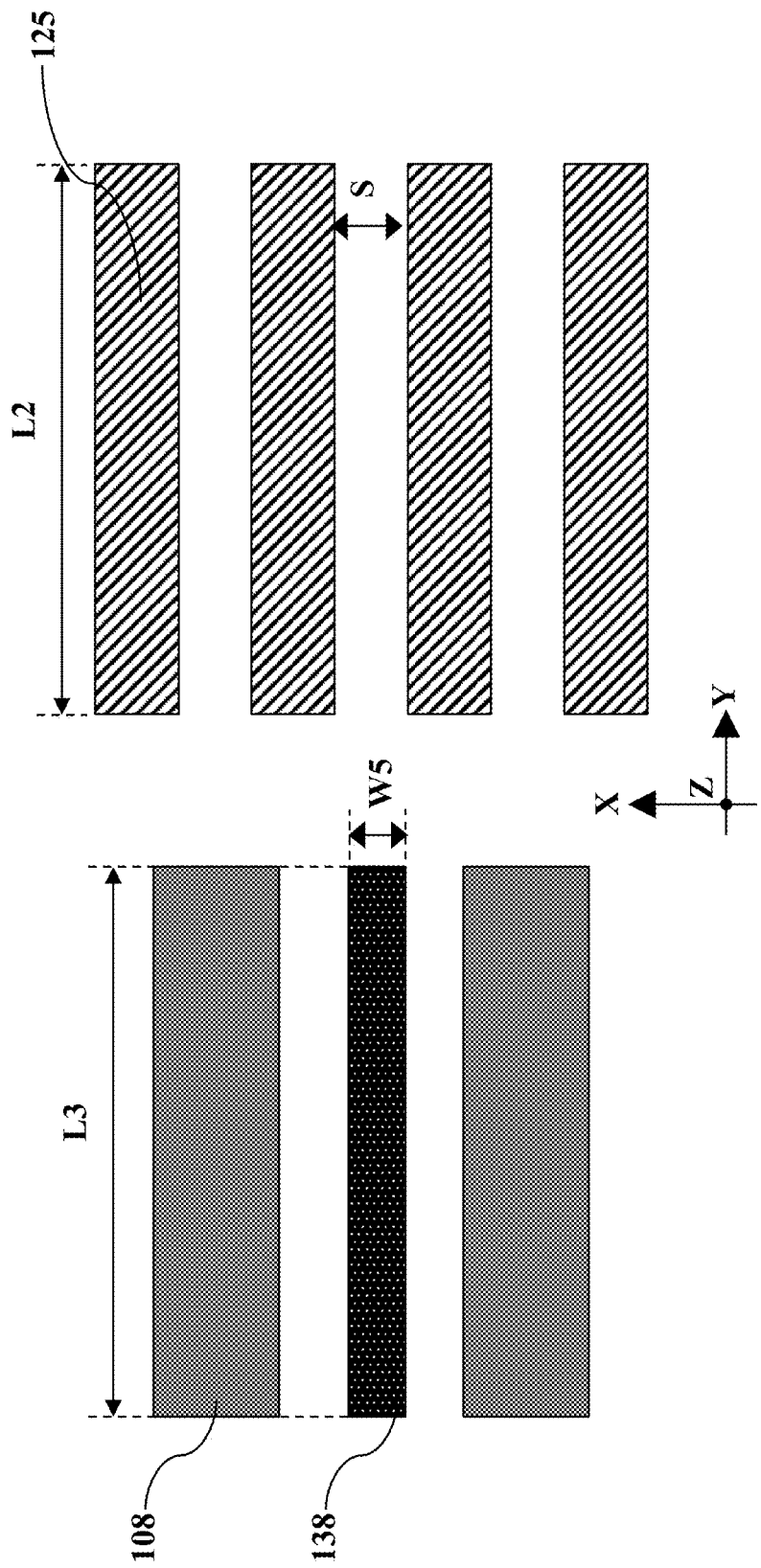

Reference is then made to FIG. 23, which is a fragmentary cross-sectional view of a workpiece 100. When the top metal layer in the layout cannot be modified and metal coverage in the top metal layer is a concern, a dummy metal feature 138 that is narrower than the spacing S is inserted in the top metal layer as shown in FIG. 23. When fabricated, the dummy metal feature 138 is disposed directly below the inter-RDL-space and has a fifth width W5 smaller than the spacing S. Because edges of the dummy metal feature 138 in FIG. 23 is spaced further away from the two redistribution features, the dummy metal feature 138 also has the benefit of reducing the risks of undesirable shorts. FIG. 24 illustrates top views of the dummy metal feature 138 and the overlying redistribution features 125 in a side-by-side fashion. As shown in FIG. 24, both the dummy metal feature 138 and the redistribution features 125 extend lengthwise along the Y direction. The dummy metal features 138 includes a third length L3 and each of the redistribution features 125 includes a second length L2. In some embodiments, the third length L3 is substantially identical to the second length L2 to ensure satisfactory stress cancelation. When other design rules prevent the third length L3 from being equal to the second length L2, the third length L3 should be made greater than the second length L2 whenever possible.

Figure 25:
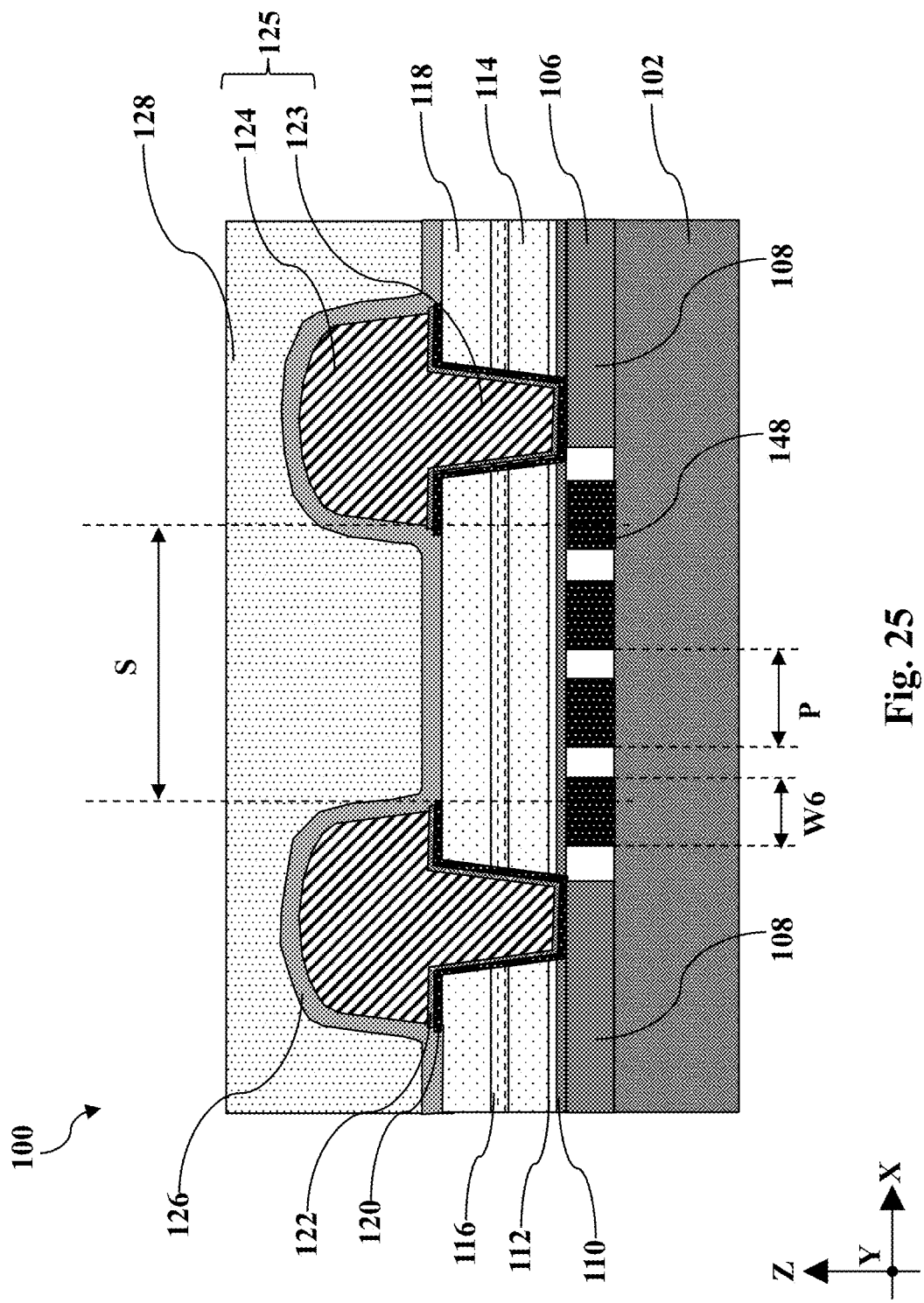
Figure 26:
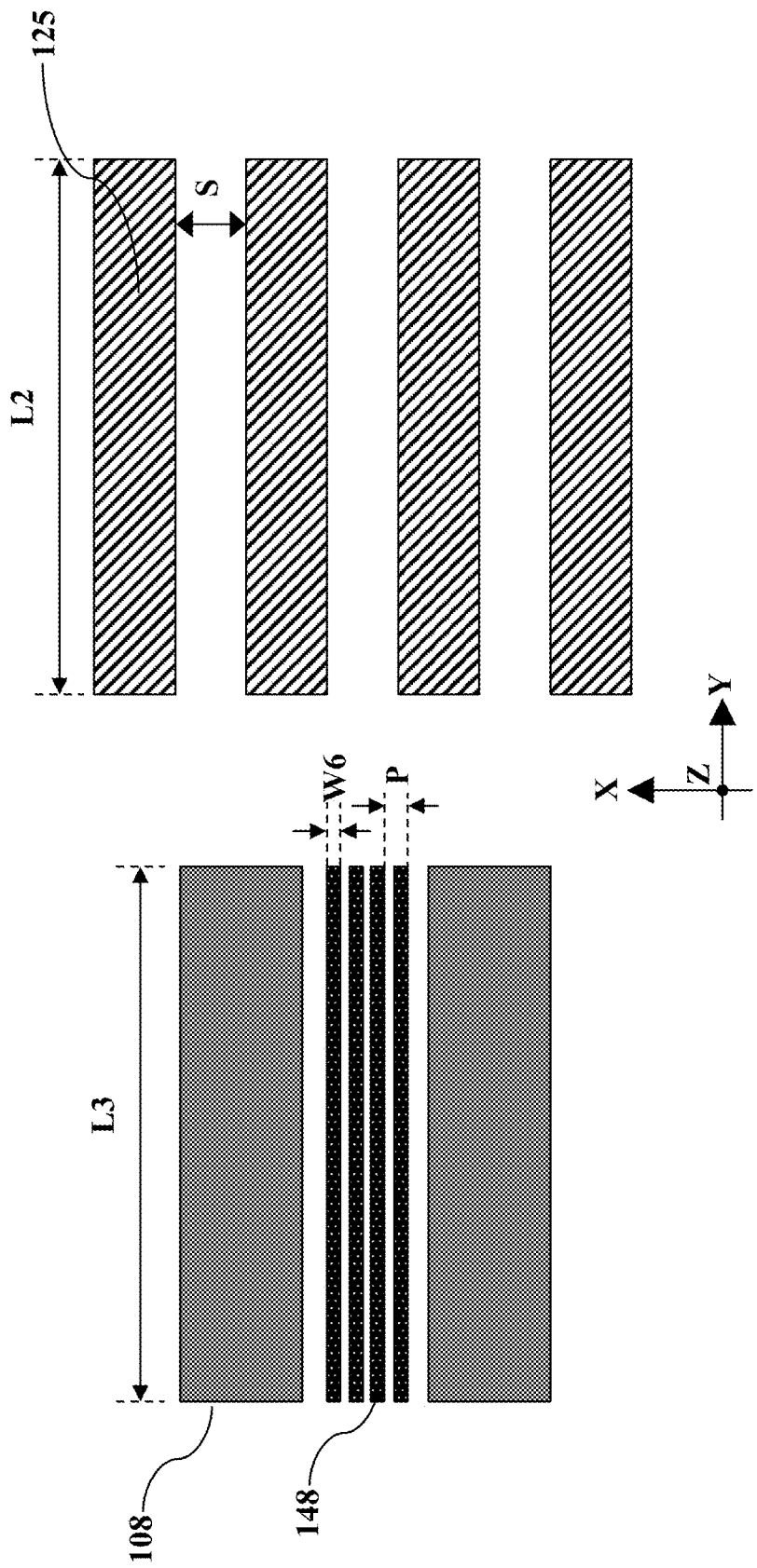

Reference is made to FIG. 25, which is a fragmentary cross-sectional view of a workpiece 100. When two adjacent redistribution features 125 may not be electrically coupled and the metal coverage in the top metal layer is a concern, uniform dummy metal fragments 148 are inserted in the top metal layer as shown in FIG. 25. With the modification, the uniform dummy metal fragments 148 span completely over the space between the two redistribution features 125 and even extend partially below the redistribution features 125. The uniform dummy metal fragments 148 are uniform in terms of widths and pitches. Each of the uniform dummy metal fragments 148 has a sixth width W6 and the uniform dummy metal fragments 148 are disposed at a pitch P. In some embodiments, the sixth width W6 may be between about 10% and about 35% of the spacing S. FIG. 26 illustrates top views of the uniform dummy metal fragments 148 and the overlying redistribution feature 125 in a side-by-side fashion. As shown in FIG. 26, each of the dummy metal fragments 148, the top metal features 108 and the redistribution features 125 all extend lengthwise along the Y direction. Each of the dummy metal fragments 148 includes the third length L3 and each of the redistribution features 125 includes the second length L2. In some embodiments, the third length L3 is substantially identical to the second length L2 to ensure satisfactory stress cancelation. When other design rules prevent the third length L3 from being equal to the second length L2, the third length L3 should be made greater than the second length L2 whenever possible.

Figure 27:
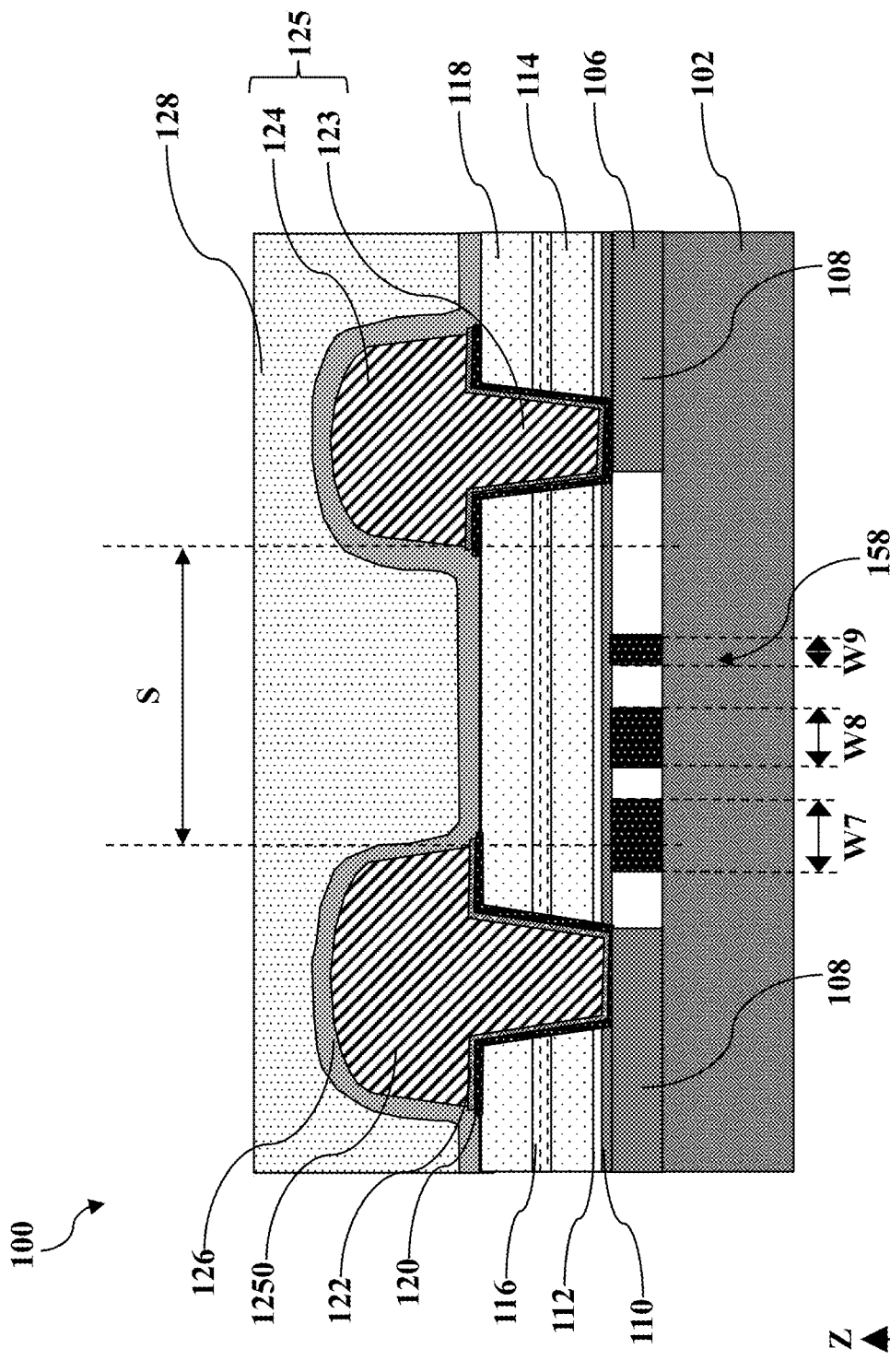
Figure 28:
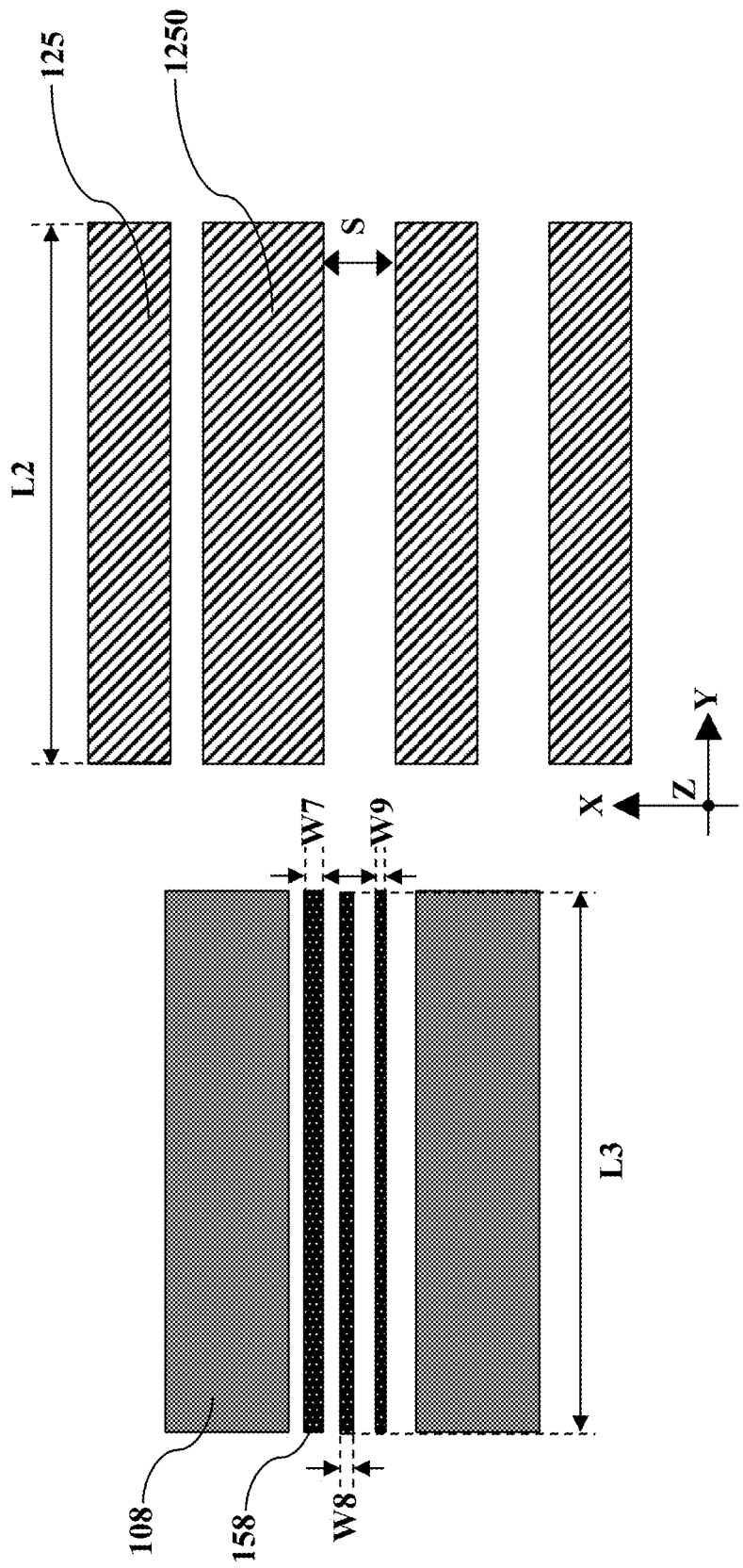

Reference is made to FIG. 27, which is a fragmentary cross-sectional view of a workpiece 100. When the metal coverage in the top metal layer is a concern and redistribution features 125 come in different sizes, non-uniform dummy metal fragments 158 may be inserted in the top metal layer as shown in FIG. 27. As illustrated in FIG. 27, the wide redistribution feature 1250 on the left-hand side is wider than the redistribution feature 125 on the right-hand side along the X direction. To effectively prevent the greater stress near the wide redistribution feature 1250 from resulting in cracks, the non-uniform dummy metal fragment 158 may be biased toward the wide redistribution feature 1250. In the embodiments represented in FIG. 27, the non-uniform dummy metal fragment 158 includes a first fragment having a seventh width W7, a second fragment having an eighth width W8, and a third fragment having a ninth width W9. The seventh width W7 is greater than the eighth width W8 and the eighth width W8 is greater than the ninth width W9. As shown in FIG. 27, the first fragment may partially enclose the wide redistribution feature 1250. FIG. 28 illustrates top views of the non-uniform dummy metal fragments 158 and the overlying redistribution feature 125 (and the wide redistribution feature 1250) in a side-by-side fashion. As shown in FIG. 28, each of the non-uniform dummy metal fragments 158, the top metal features 108, the wide redistribution feature 1250, and the redistribution features 125 all extend lengthwise along the Y direction. Each of the non-uniform dummy metal fragments 158 includes the third length L3 and each of the redistribution features 125 (and the wide redistribution feature 1250) includes the second length L2. In some embodiments, the third length L3 is substantially identical to the second length L2 to ensure satisfactory stress cancelation. When other design rules prevent the third length L3 from being equal to the second length L2, the third length L3 should be made greater than the second length L2 whenever possible.

Figure 29:
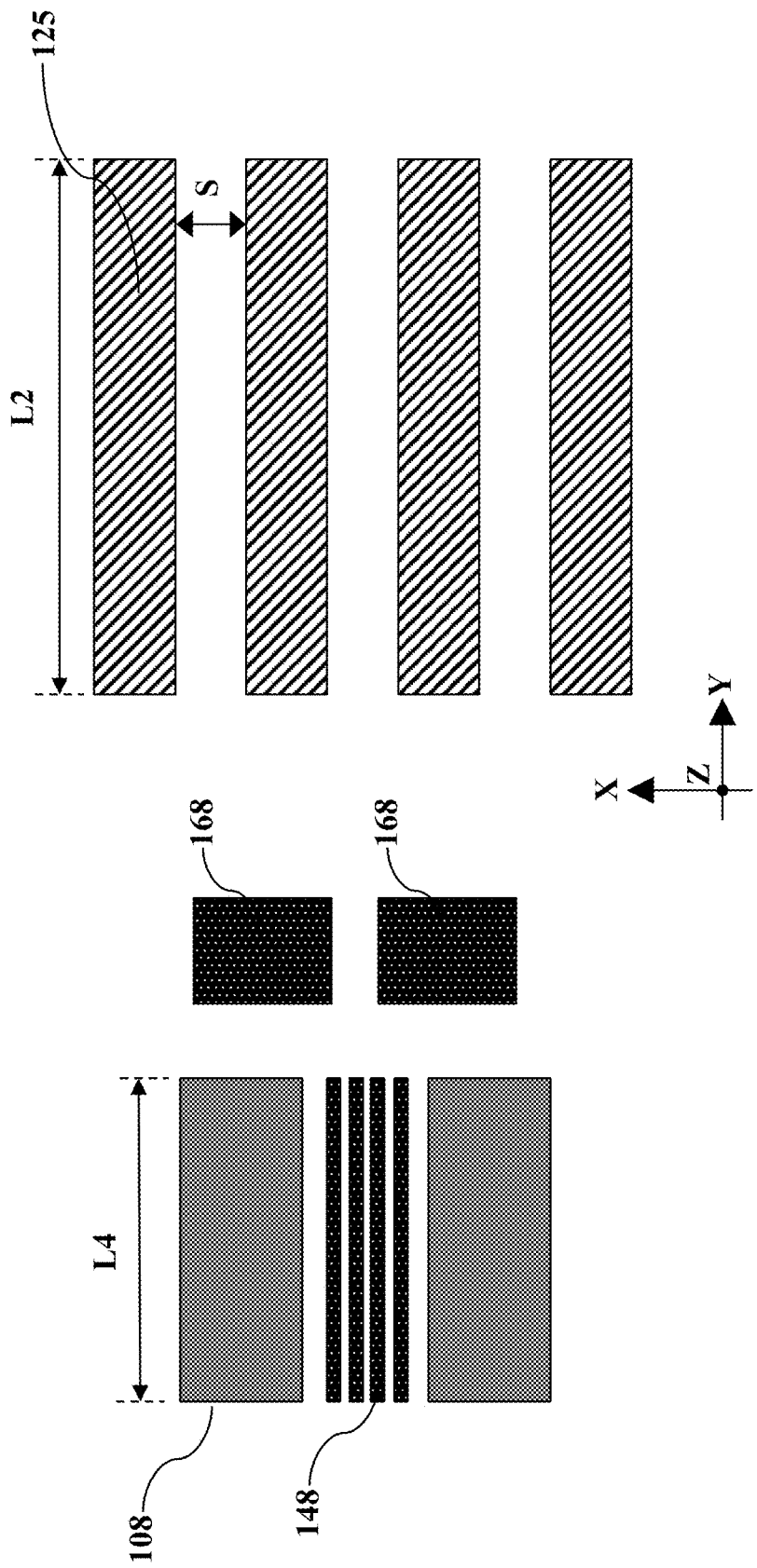

Reference is then made to FIG. 29, which is a fragmentary cross-sectional view of a workpiece 100. When a top metal feature 108 is shorter than an overlying redistribution feature 125, a combination of uniform dummy metal fragments 148 and a dummy metal block 168 are inserted in the top metal layer as shown in FIG. 29. In the embodiments represented in FIG. 29, the top metal features 108 each have a fourth length L4 smaller than the second length L2 of the redistribution features 125. In FIG. 29, the uniform dummy metal fragments 148 are inserted between the two top metal features 108 and two dummy metal blocks 168 are inserted adjacent edges of the top metal features 108 to make up the length shortfalls of the top metal features. Unlike the uniform dummy metal fragments 148, the dummy metal blocks 168 may be substantially square from a top view or extend lengthwise along the X direction.

One aspect of the present disclosure involves a method. The method includes receiving a layout that includes a top metal layer having a plurality of top metal features, an insulation layer disposed over top metal layer, a redistribution layer including a plurality of redistribution features, and a passivation layer disposed over the redistribution layer. The method further includes, at a first determination step, determining whether the plurality of top metal features in the top metal layer are amenable to modifications. When the plurality of top metal features in the top layer are determined to be amenable to modifications at the first determination step, the method includes modifying the layout such that at least a portion of one of the plurality of top metal features is disposed directly below a space between two adjacent ones of the plurality of redistribution features, to result in a first modified layout. When the plurality of top metal features in the top layer are determined to be not amenable to modifications at the first determination step, the method includes inserting a metal feature in the top metal layer of the layout such that at least a portion the metal feature is disposed directly below the space between two adjacent ones of the plurality of redistribution features, to result in a second modified layout.

In some embodiments, the method further includes, at a second determination step, determining whether an additional metal feature provides benefits to the first modified layout. When the second determination step determines that the additional metal feature provides benefits to the first modified layout, the method further includes inserting the metal feature in the top metal layer such that at least a portion of the metal feature is disposed directly below the space between two adjacent ones of the plurality of redistribution features. In some implementations, the plurality of top metal features and the plurality of redistribution features extend lengthwise along a first direction. In some instances, the plurality of redistribution features include a first redistribution feature and a second redistribution feature. A width of the first redistribution feature is greater than a width of the second redistribution feature. The metal feature is closer to the first redistribution feature than to the second redistribution feature. In some embodiments, the method further includes fabricating a semiconductor structure according to the first modified layout or the second modified layout. In some embodiments, the fabricating includes forming the plurality of top metal features using copper or aluminum, forming the insulation layer using silicon nitride, forming the plurality of redistribution features using tantalum nitride, titanium nitride, copper, aluminum, nickel, or cobalt, and forming the passivation layer using silicon nitride. In some implementations, the layout further includes a polymeric layer over the passivation layer. In some instances, the layout further includes a passive device embedded in the insulation layer. In some embodiments, the passive device includes a metal-insulator-metal capacitor.

Another aspect of the present disclosure involves a method. The method includes receiving a layout that includes a plurality of transistors, a top metal layer over the plurality of transistor and including a plurality of top metal features, each of the plurality of top metal features being in electrical communication with one of the plurality of transistors, an insulation layer disposed over top metal layer, a redistribution layer including a plurality of redistribution features, and a passivation layer disposed over the redistribution layer. The method further includes, at a determination step, determining whether the plurality of top metal features in the top metal layer are amenable to modifications, and when the determination steps determines that the plurality of top metal features in the top layer are not amenable to modifications, inserting a metal feature in the top metal layer of the layout such that at least a portion of the metal feature is disposed directly below a space between two adjacent ones of the plurality of redistribution features to result in a modified layout.

In some embodiments, the metal feature is electrically isolated from the plurality of transistors. In some instances, the metal feature is electrically coupled to one of the plurality of redistribution features. In some implementations, the metal feature includes an array of elongated metal fragments that extend parallel to one another. In some embodiments, the layout further includes a passive device embedded in the insulation layer. In some instances, the passive device includes a metal-insulator-metal capacitor. In some embodiments, the method may further include fabricating a semiconductor structure according to the modified layout.

Still another aspect of the present disclosure involves a semiconductor structure. The semiconductor structure includes a plurality of transistors, an interconnect structure electrically coupled to the plurality of transistors, a metal feature disposed over the interconnect structure and electrically isolated from the plurality of transistors, an insulation layer disposed over the metal feature, and a first redistribution feature and a second redistribution feature disposed over the insulation layer. A space between the first redistribution feature and the second redistribution feature is disposed directly over at least a portion of the metal feature.

In some embodiments, the metal feature, the first redistribution feature and the second redistribution feature extend lengthwise along a direction. In some implementations, the semiconductor structure may further include a passivation layer extending conformally along surfaces of the first redistribution feature and the second redistribution feature, and a polymer layer disposed over the passivation layer. In some embodiments, the passivation layer includes silicon nitride and the polymer layer includes polyimide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a layout that includes:
      a top metal layer comprising a plurality of top metal features,
      an insulation layer disposed over the top metal layer,
      a redistribution layer comprising a plurality of redistribution features, and
      a passivation layer disposed over the redistribution layer;
   at a first determination step, determining whether the plurality of top metal features in the top metal layer are amenable to modifications;
   when the plurality of top metal features in the top metal layer are determined to be amenable to modifications at the first determination step, modifying the layout such that at least a portion of one of the plurality of top metal features is disposed directly below a space between two adjacent ones of the plurality of redistribution features, the modifying resulting in a first modified layout; and
   when the plurality of top metal features in the top metal layer are determined to be not amenable to modifications at the first determination step, inserting a metal feature in the top metal layer of the layout such that at least a portion the metal feature is disposed directly below the space between two adjacent ones of the plurality of redistribution features, the inserting resulting a second modified layout.

2. The method of claim 1, further comprising:
   at a second determination step, determining whether an additional metal feature provides benefits to the first modified layout; and
   when the second determination step determines that the additional metal feature provides benefits to the first modified layout, inserting the metal feature in the top metal layer such that at least a portion of the metal feature is disposed directly below the space between two adjacent ones of the plurality of redistribution features.

3. The method of claim 1, wherein the plurality of top metal features and the plurality of redistribution features extend lengthwise along a first direction.

4. The method of claim 3,
   wherein the plurality of redistribution features comprise a first redistribution feature and a second redistribution feature,
   wherein a width of the first redistribution feature is greater than a width of the second redistribution feature,
   wherein the metal feature is closer to the first redistribution feature than to the second redistribution feature.

5. The method of claim 1, further comprising:
   fabricating a semiconductor structure according to the first modified layout or the second modified layout.

6. The method of claim 5, wherein the fabricating comprises:
   forming the plurality of top metal features using copper or aluminum,
   forming the insulation layer using silicon nitride,
   forming the plurality of redistribution features using tantalum nitride, titanium nitride, copper, aluminum, nickel, or cobalt, and
   forming the passivation layer using silicon nitride.

7. The method of claim 1, wherein the layout further comprising a polymeric layer over the passivation layer.

8. The method of claim 1, wherein the layout further comprises a passive device embedded in the insulation layer.

9. The method of claim 8, wherein the passive device comprises a metal-insulator-metal capacitor.

10. A method, comprising:
    receiving a layout that includes:
       a top metal layer comprising a first top metal feature and a second top metal feature, wherein the first top metal feature comprises a via portion and a line portion over the via portion,
       an insulation layer disposed over the top metal layer and comprising a metal-insulator-metal capacitor, wherein the via portion extending through the metal-insulator-metal capacitor, and
       a redistribution layer comprising a first redistribution feature disposed over and electrically coupled to the first top metal feature and a second redistribution feature disposed over and electrically coupled to the second top metal feature; and
    inserting a plurality of metal features in the top metal layer of the layout such that at least a portion of the plurality of metal features is disposed directly below a space between the first redistribution feature and the second redistribution feature, the inserting resulting a modified layout.

11. The method of claim 10, wherein the plurality of metal features are electrically isolated from the first top metal feature and the second top metal feature.

12. The method of claim 10,
    wherein a width of the first redistribution feature is greater than a width of the second redistribution feature,
    wherein the plurality of metal features comprise a first metal feature adjacent the first top metal feature and a second metal feature adjacent the second top metal feature,
    wherein a width of the first top metal feature is greater than a width of the second top metal feature.

13. The method of claim 10,
    wherein the first top metal feature and the second top metal feature extend along a direction,
    wherein the plurality of metal features extend parallel to one another along the direction.

14. The method of claim 13,
    wherein the first top metal feature, the second top metal feature, and the plurality of metal features comprise a first length along the direction, wherein the first redistribution feature and second redistribution feature comprise a second length along the direction, wherein the first length is greater than the second length.

15. The method of claim 10, wherein the metal-insulator-metal capacitor embedded in the insulation layer comprises a plurality of conductor plates, wherein the via portion is electrically coupled to at least one of the plurality of conductor plates.

16. The method of claim 10, further comprising:

fabricating a semiconductor structure according to the modified layout.

17. A method, comprising:

receiving a layout that includes:
- a top metal layer comprising a first top metal feature and a second top metal feature,
- a first insulation layer disposed over the top metal layer,
- a passive device disposed over the first insulation layer,
- a second insulation layer disposed over the passive device,
- a first redistribution feature and a second redistribution feature extending through the second insulation layer, the passive device, and the first insulation layer to contact the first top metal feature and the second top metal feature, respectively, and
- a passivation layer disposed over top surfaces of the second insulation layer, the first redistribution feature and the second redistribution feature; and inserting a plurality of metal features in the top metal layer of the layout such that at least a portion of the plurality of metal features is disposed directly below a space between the first redistribution feature and the second redistribution feature, the inserting resulting a modified layout.

18. The method of claim 17, wherein the passive device comprises a metal-insulator-metal capacitor.

19. The method of claim 17, wherein each of the first top metal feature and the second top metal feature is spaced apart from the first insulation layer and the second insulation layer by a barrier layer.

20. The method of claim 17, wherein each of the first top metal feature and the second top metal feature comprises a portion that rises above a top surface of the second insulation layer.

* * * * *